(12) United States Patent  (10) Patent No.: US 7,675,180 B1
St. Amand et al.  (45) Date of Patent: Mar. 9, 2010

(54) STACKED ELECTRONIC COMPONENT PACKAGE HAVING FILM-ON-WIRE SPACER

(75) Inventors: Roger D. St. Amand, Tempe, AZ (US); ChangSuk Han, Sungnam (KR); YounSang Kim, Sungnam (KR); KyungRok Park, Kwangju (KR); Vladimir Perelman, Fremont, CA (US)

(73) Assignee: Amkor Technology, Inc., Chandler, AZ (US)

( * ) Notice: Subject to any disclaimer, the term of this patent is extended or adjusted under 35 U.S.C. 154(b) by 356 days.

(21) Appl. No.: 11/356,921

(22) Filed: Feb. 17, 2006

(51) Int. Cl.
*H01L 23/52* (2006.01)
*H01L 23/48* (2006.01)
*H01L 29/40* (2006.01)

(52) U.S. Cl. .............. 257/777; 257/E25.013; 257/685; 257/686; 257/723; 438/108; 361/760

(58) Field of Classification Search .......... 257/E27.137, 257/E27.144, E27.161, 773, 685, 686, 723, 257/724, 777, E25.013; 438/108, 109; 361/760
See application file for complete search history.

(56) References Cited

U.S. PATENT DOCUMENTS

| 3,880,528 | A | 4/1975 | Petersen et al. ............. 356/225 |
| 4,055,761 | A | 10/1977 | Shimomura ................. 250/239 |
| 4,491,865 | A | 1/1985 | Danna et al. ................... 358/98 |
| 4,567,643 | A | 2/1986 | Droguet et al. ............... 29/575 |
| 4,763,188 | A | 8/1988 | Johnson |
| 4,896,217 | A | 1/1990 | Miyazawa et al. ..... 358/213.11 |
| 4,947,234 | A | 8/1990 | Einzinger et al. ............. 357/68 |
| 4,999,142 | A | 3/1991 | Fukushima et al. .......... 264/1.7 |
| 5,012,323 | A | 4/1991 | Farnworth |
| 5,023,442 | A | 6/1991 | Taniguchi et al. ........ 250/208.1 |
| 5,025,306 | A | 6/1991 | Johnson et al. |
| 5,068,713 | A | 11/1991 | Toda ........................... 357/72 |
| 5,122,861 | A | 6/1992 | Tamura et al. ................ 357/74 |
| 5,220,198 | A | 6/1993 | Tsuji .......................... 257/731 |
| 5,274,456 | A | 12/1993 | Izumi et al. ................. 358/209 |

(Continued)

FOREIGN PATENT DOCUMENTS

EP  0 503 201  9/1992

(Continued)

OTHER PUBLICATIONS

St. Amand et al., U.S. Appl. No. 11/356,919, entitled "Stacked electronic component package having single-sided film spacer", filed Feb. 17, 2006.

(Continued)

*Primary Examiner*—Chris C Chu
(74) *Attorney, Agent, or Firm*—Gunnison, McKay & Hodgson, L.L.P.; Serge J. Hodgson

(57) ABSTRACT

A film-on-wire spacer covers an entire upper surface of a lower electronic component. Accordingly, an upper electronic component is supported above bond pads and lower bond wires of the lower electronic component. This decreases the stress on the upper electronic component, e.g., during wirebonding, and thus decreases the chance of cracking the upper electronic component. Further, the lower bond wires are enclosed in and protected by the film-on-wire spacer. Further, the film-on-wire spacer is thin resulting in a minimum height of the stacked electronic component package.

19 Claims, 13 Drawing Sheets

U.S. PATENT DOCUMENTS

| | | | |
|---|---|---|---|
| 5,291,061 A | 3/1994 | Ball | 257/686 |
| 5,323,060 A | 6/1994 | Fogal et al. | 257/777 |
| 5,328,079 A | 7/1994 | Mathew et al. | |
| 5,347,429 A | 9/1994 | Kohno et al. | |
| 5,365,101 A | 11/1994 | Tonai | 257/434 |
| 5,383,034 A | 1/1995 | Imamura et al. | 358/474 |
| 5,400,072 A | 3/1995 | Izumi et al. | 348/335 |
| 5,412,229 A | 5/1995 | Kuhara et al. | 257/183 |
| 5,422,435 A | 6/1995 | Takiar et al. | |
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |
| 5,463,229 A | 10/1995 | Takase et al. | 257/59 |
| 5,463,253 A | 10/1995 | Waki et al. | |
| 5,489,995 A | 2/1996 | Iso et al. | 358/483 |
| 5,495,398 A | 2/1996 | Takiar et al. | |
| 5,502,289 A | 3/1996 | Takiar et al. | |
| 5,523,608 A | 6/1996 | Kitaoka et al. | 257/433 |
| 5,570,204 A | 10/1996 | Kumashiro | 358/471 |
| 5,581,094 A | 12/1996 | Hara et al. | 257/80 |
| 5,604,362 A | 2/1997 | Jedlicka et al. | 257/233 |
| 5,617,131 A | 4/1997 | Murano et al. | 347/233 |
| 5,655,189 A | 8/1997 | Murano | 399/220 |
| 5,672,902 A | 9/1997 | Hatanaka et al. | 257/431 |
| 5,689,135 A | 11/1997 | Ball | |
| 5,696,031 A | 12/1997 | Wark | |
| 5,715,147 A | 2/1998 | Nagano | |
| 5,721,452 A | 2/1998 | Fogal et al. | |
| 5,739,581 A | 4/1998 | Chillara et al. | |
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,815,372 A | 9/1998 | Gallas | |
| 5,821,532 A | 10/1998 | Beaman et al. | 250/239 |
| 5,825,560 A | 10/1998 | Ogura et al. | 359/822 |
| 5,861,654 A | 1/1999 | Johnson | 257/433 |
| 5,866,949 A | 2/1999 | Schueller | |
| 5,886,412 A | 3/1999 | Fogal et al. | |
| 5,888,606 A | 3/1999 | Senoo et al. | 428/66.6 |
| 5,894,380 A | 4/1999 | Sasada et al. | 360/103 |
| 5,902,993 A | 5/1999 | Okushiba et al. | 250/208.1 |
| 5,904,497 A | 5/1999 | Akram | 438/106 |
| 5,932,875 A | 8/1999 | Chung et al. | 250/239 |
| 5,952,725 A | 9/1999 | Ball | |
| 5,973,403 A | 10/1999 | Wark | |
| 5,998,878 A | 12/1999 | Johnson | 257/797 |
| 6,005,778 A | 12/1999 | Spielberger et al. | |
| 6,011,294 A | 1/2000 | Wetzel | 257/434 |
| 6,011,661 A | 1/2000 | Weng | 359/819 |
| 6,013,948 A | 1/2000 | Akram et al. | |
| 6,020,582 A | 2/2000 | Bawolek et al. | 250/208.1 |
| RE36,613 E | 3/2000 | Ball | |
| 6,037,655 A | 3/2000 | Philbrick et al. | 257/680 |
| 6,051,886 A | 4/2000 | Fogal et al. | |
| 6,057,598 A | 5/2000 | Payne et al. | |
| 6,060,722 A | 5/2000 | Havens et al. | 250/566 |
| 6,072,232 A | 6/2000 | Li et al. | 257/680 |
| 6,072,243 A | 6/2000 | Nakanishi | |
| 6,080,264 A | 6/2000 | Ball | |
| 6,084,297 A | 7/2000 | Brooks et al. | |
| 6,118,176 A | 9/2000 | Tao et al. | |
| 6,122,009 A | 9/2000 | Ueda | 348/335 |
| 6,130,448 A | 10/2000 | Bauer et al. | 257/222 |
| 6,133,637 A | 10/2000 | Hikita et al. | |
| 6,140,149 A | 10/2000 | Wark | |
| 6,147,389 A | 11/2000 | Stern et al. | 257/434 |
| 6,153,927 A | 11/2000 | Raj et al. | 257/680 |
| 6,157,080 A | 12/2000 | Tamaki et al. | |
| 6,163,076 A | 12/2000 | Lee et al. | |
| 6,184,514 B1 | 2/2001 | Rezende et al. | 250/208.1 |
| 6,214,641 B1 | 4/2001 | Akram | |
| 6,215,193 B1 | 4/2001 | Tao et al. | |
| 6,252,305 B1 | 6/2001 | Lin et al. | |
| 6,258,626 B1 | 7/2001 | Wang et al. | |
| 6,316,838 B1 | 11/2001 | Ozawa et al. | |
| 6,326,696 B1 | 12/2001 | Horton et al. | |
| 6,333,562 B1 | 12/2001 | Lin | |
| 6,339,255 B1 | 1/2002 | Shin | 257/686 |
| 6,340,846 B1 | 1/2002 | LoBianco et al. | 257/783 |
| 6,351,028 B1* | 2/2002 | Akram | 257/686 |
| 6,359,340 B1 | 3/2002 | Lin et al. | |
| 6,365,966 B1 | 4/2002 | Chen et al. | |
| 6,380,615 B1 | 4/2002 | Park et al. | 257/686 |
| 6,384,397 B1 | 5/2002 | Takiar et al. | 250/208.1 |
| 6,384,472 B1 | 5/2002 | Huang | 257/680 |
| 6,387,728 B1 | 5/2002 | Pai et al. | |
| 6,388,313 B1 | 5/2002 | Lee et al. | 257/686 |
| 6,392,703 B1 | 5/2002 | Uchino et al. | 348/373 |
| 6,414,381 B1 | 7/2002 | Takeda | 257/676 |
| 6,437,449 B1 | 8/2002 | Foster | |
| 6,461,897 B2 | 10/2002 | Lin et al. | |
| 6,472,758 B1* | 10/2002 | Glenn et al. | 257/777 |
| 6,476,475 B1 | 11/2002 | Lee | |
| 6,498,624 B1 | 12/2002 | Ogura et al. | 348/335 |
| 6,500,698 B2 | 12/2002 | Shin | 438/112 |
| 6,503,776 B2* | 1/2003 | Pai et al. | 438/106 |
| 6,509,560 B1 | 1/2003 | Glenn et al. | 250/239 |
| 6,518,656 B1 | 2/2003 | Nakayama et al. | 257/680 |
| 6,531,784 B1 | 3/2003 | Shim et al. | |
| 6,545,365 B2* | 4/2003 | Kondo et al. | 257/777 |
| 6,552,416 B1 | 4/2003 | Foster | |
| 6,555,917 B1* | 4/2003 | Heo | 257/777 |
| 6,559,526 B2* | 5/2003 | Lee et al. | 257/676 |
| 6,576,997 B2* | 6/2003 | Uchida | 257/723 |
| 6,593,662 B1 | 7/2003 | Pu et al. | 257/777 |
| 6,603,072 B1 | 8/2003 | Foster et al. | |
| 6,620,651 B2 | 9/2003 | He et al. | 438/113 |
| 6,621,156 B2 | 9/2003 | Kimura | 257/686 |
| 6,627,480 B2 | 9/2003 | Kim | 438/109 |
| 6,627,864 B1 | 9/2003 | Glenn et al. | 250/208.1 |
| 6,627,872 B1 | 9/2003 | FuKamura et al. | 250/239 |
| 6,650,019 B2 | 11/2003 | Glenn et al. | 257/777 |
| 6,657,290 B2* | 12/2003 | Fukui et al. | 257/686 |
| 6,710,455 B2* | 3/2004 | Goller et al. | 257/777 |
| 6,713,857 B1 | 3/2004 | Tsai | |
| 6,730,543 B2 | 5/2004 | Akram | 438/109 |
| 6,737,299 B1 | 5/2004 | Jiang | 438/109 |
| 6,762,796 B1 | 7/2004 | Nakajoh et al. | 348/340 |
| 6,767,753 B2 | 7/2004 | Huang | 438/25 |
| 6,798,049 B1 | 9/2004 | Shin et al. | |
| 6,833,287 B1 | 12/2004 | Hur et al. | 438/107 |
| 6,838,761 B2 | 1/2005 | Karnezos | |
| 6,849,950 B1 | 2/2005 | Matsuura | 257/777 |
| 6,857,470 B2* | 2/2005 | Park et al. | 165/185 |
| 6,867,438 B1 | 3/2005 | Maruyama et al. | 257/184 |
| 6,894,380 B2 | 5/2005 | Jiang et al. | 257/686 |
| 6,911,723 B2 | 6/2005 | Akram | 257/686 |
| 6,977,439 B2* | 12/2005 | Kang et al. | 257/777 |
| 7,176,558 B2* | 2/2007 | Kang et al. | 257/676 |
| 7,205,651 B2* | 4/2007 | Do et al. | 257/706 |
| 7,227,086 B2* | 6/2007 | Lee et al. | 174/521 |
| 7,285,864 B2* | 10/2007 | Takyu et al. | 257/777 |
| 7,323,786 B2* | 1/2008 | Sasaki | 257/777 |
| 2001/0023994 A1 | 9/2001 | Oka | |
| 2002/0014689 A1 | 2/2002 | Lo et al. | |
| 2002/0030262 A1 | 3/2002 | Akram | 257/686 |
| 2002/0030263 A1 | 3/2002 | Akram | |
| 2002/0064905 A1 | 5/2002 | Park et al. | |
| 2002/0096755 A1 | 7/2002 | Fukui et al. | |
| 2002/0109216 A1* | 8/2002 | Matsuzaki et al. | 257/686 |
| 2002/0125556 A1 | 9/2002 | Oh et al. | 257/685 |
| 2002/0130398 A1 | 9/2002 | Huang | |
| 2002/0171136 A1 | 11/2002 | Hiraoka et al. | |
| 2002/0195624 A1* | 12/2002 | Glenn et al. | 257/200 |

| | | | | | |
|---|---|---|---|---|---|
| 2003/0001252 A1 | 1/2003 | Ku et al. | JP | 03-169062 | 7/1991 |
| 2003/0038355 A1 | 2/2003 | Derderian | JP | 04-028260 | 1/1992 |
| 2003/0038356 A1 | 2/2003 | Derderian | JP | 04-056262 | 2/1992 |
| 2003/0038357 A1* | 2/2003 | Derderian ............. 257/686 | JP | 04-096358 | 3/1992 |
| 2003/0047754 A1 | 3/2003 | Hsu et al. | JP | 04-116859 | 4/1992 |
| 2003/0127719 A1* | 7/2003 | Chang .................. 257/685 | JP | 05-013665 | 1/1993 |
| 2003/0137042 A1 | 7/2003 | Mess et al. | JP | 05-075015 | 3/1993 |
| 2003/0137595 A1 | 7/2003 | Takachi ................ 348/340 | JP | 05-109975 | 4/1993 |
| 2003/0178710 A1* | 9/2003 | Kang et al. ............ 257/673 | JP | 05-136323 | 6/1993 |
| 2003/0189259 A1 | 10/2003 | Kurita et al. | JP | 08-288455 | 11/1996 |
| 2003/0199118 A1 | 10/2003 | Park et al. | JP | 09-021938 | 1/1997 |
| 2004/0041249 A1 | 3/2004 | Tsai et al. | JP | 09-232548 | 9/1997 |
| 2004/0051168 A1 | 3/2004 | Arai et al. | JP | 10-027880 | 1/1998 |
| 2004/0119152 A1 | 6/2004 | Karnezos et al. | JP | 10-256470 | 9/1998 |
| 2004/0126926 A1 | 7/2004 | Arai et al. | JP | 10-302587 | 11/1998 |
| 2004/0169285 A1 | 9/2004 | Verma et al. | JP | 2001-308262 | 11/2001 |
| 2004/0200885 A1 | 10/2004 | Derderian | JP | 2002-093992 | 3/2002 |
| 2004/0241907 A1 | 12/2004 | Higashino et al. | JP | 2002-222913 | 8/2002 |
| 2005/0012196 A1 | 1/2005 | Akram ................. 257/686 | JP | 2004-072009 | 3/2004 |
| 2005/0104183 A1 | 5/2005 | Kuroda et al. .......... 257/686 | JP | 2004-193363 | 7/2004 |
| 2005/0133916 A1 | 6/2005 | Karnezos .............. 257/738 | KR | 2001-0001596 | 1/2001 |
| 2005/0179127 A1 | 8/2005 | Takyu et al. | KR | 2002-0015214 | 2/2002 |
| 2006/0097374 A1 | 5/2006 | Egawa ................. 257/686 | KR | 2002-0062857 | 7/2002 |
| | | | KR | 2002-0072145 | 9/2002 |
| | | | KR | 2003-0075860 | 9/2003 |

FOREIGN PATENT DOCUMENTS

| | | |
|---|---|---|
| GB | 1022329 | 7/1964 |
| GB | 2 146 504 | 4/1985 |
| JP | 56-062351 | 5/1981 |
| JP | 59-228755 | 12/1984 |
| JP | 60-182731 | 9/1985 |
| JP | 61-117858 | 6/1986 |
| JP | 62-008534 | 1/1987 |
| JP | 62-126661 | 6/1987 |
| JP | 62-224047 | 10/1987 |
| JP | 63-128736 | 6/1988 |
| JP | 63-244654 | 10/1988 |
| JP | 64-001269 | 1/1989 |
| JP | 64-028856 | 1/1989 |
| JP | 64-071162 | 3/1989 |
| JP | 01-099248 | 4/1989 |
| JP | 03-165550 | 7/1991 |
| WO | WO 93/22787 | 11/1993 |
| WO | WO 00/38103 | 6/2000 |
| WO | WO 03/019660 | 3/2003 |

OTHER PUBLICATIONS

Kim et al., U.S. Appl. No. 11/440,662, entitled "Semiconductor package and method of making the same", filed May 24, 2006.

Oh et al., "A Stacked Semiconductor Package Having an Insulator to Prevent Shorting of Wirebonds", U.S. Appl. No. 10/015,374, filed Dec. 12, 2001.

Oh et al., "Method of Forming a Stacked Semiconductor Package", U.S. Appl. No. 11/286,970, filed Nov. 22, 2005.

Oh et al., "Adhesive on Wire Stacked Semiconductor Package", U.S. Appl. No. 12/317,649, filed Dec. 23, 2008.

* cited by examiner

STACKED ELECTRONIC COMPONENT PACKAGE HAVING FILM-ON-WIRE SPACER

BACKGROUND OF THE INVENTION

1. Field of the Invention

The present invention relates generally to the packaging of electronic components. More particularly, the present invention relates to a stacked electronic component package and method for fabricating the same.

2. Description of the Related Art

To reduce the size of electronic component packages, electronic components such as semiconductor dies were stacked one upon another within a stacked electronic component package. To space the upper electronic component above the lower bond wires connected to the bond pads of the lower electronic component, a spacer was used.

The spacer was mounted to the upper surface of the lower electronic component inward of the bond pads on the upper surface of the lower electronic component. The lower bond wires were connected to the bond pads on the upper surface of the lower electronic component. The lower surface of the upper electronic component was mounted to the spacer, which spaced the lower surface of the upper electronic component away from the upper surface of the lower electronic component and the lower bond wires.

A spacer made of silicon, i.e., a silicon spacer, was used. As a silicon spacer is nonadhesive, use of the silicon spacer required an upper and lower adhesive. The lower adhesive mounted the lower surface of the silicon spacer to the upper surface of the lower electronic component inward of the bond pads of the lower electronic component. The upper adhesive, e.g., a film adhesive, was applied to the entire lower surface of the upper electronic component. The upper electronic component having the upper adhesive applied to the entire lower surface of the upper electronic component was then mounted to the silicon spacer.

An alternative to the silicon spacer was a double-sided film spacer. A double-sided film spacer had adhesive on both the upper and lower surfaces of the double-sided film spacer. This allowed the double-sided film spacer to be mounted directly to the upper surface of the lower electronic component inward of the bond pads of the lower electronic component and the upper electronic component to be directly mounted to the double-sided film spacer with or without the application of additional adhesives. This simplified manufacturing resulting in a lower manufacturing cost of the stacked electronic component package. Further, a double-sided film spacer was less expensive than a silicon spacer again resulting in a lower manufacturing cost of the stacked electronic component package.

One problem associated with both the silicon spacer and the double-sided film spacer was that the spacer was mounted directly to the upper surface of the lower electronic component inward of the bond pads of the lower electronic component. Accordingly, the upper electronic component was unsupported above the bond pads and bond wires of the lower electronic component. This increased the stress on the upper electronic component, e.g., during wirebonding, and thus increased the chance of cracking the upper electronic component. Further, both the silicon spacer and the double-sided film spacer were relatively thick resulting in a relatively tall stacked electronic component package.

SUMMARY OF THE INVENTION

In accordance with one embodiment, a film-on-wire spacer covers an entire upper surface of a lower electronic component and the lower bond wires. Accordingly, an upper electronic component is supported above bond pads and lower bond wires of the lower electronic component. This decreases the stress on the upper electronic component, e.g., during wirebonding, and thus decreases the chance of cracking the upper electronic component. Further, the lower bond wires are enclosed in and protected by the film-on-wire spacer. Further, the film-on-wire spacer is thin resulting in a minimum height of the stacked electronic component package.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
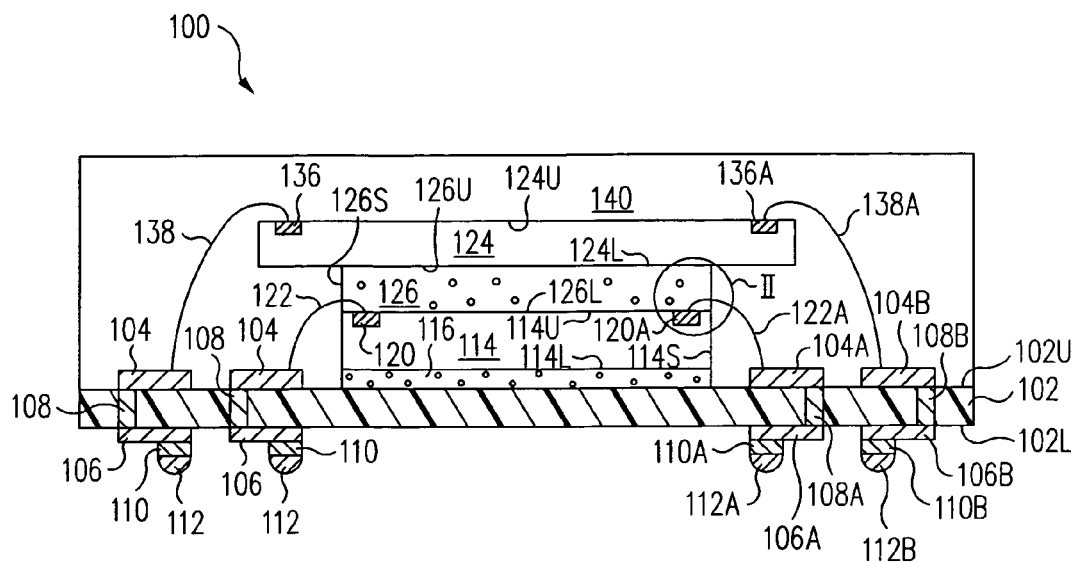
FIG. 1 is a cross-sectional view of a stacked electronic component package in accordance with one embodiment of the present invention.
Figure 2:
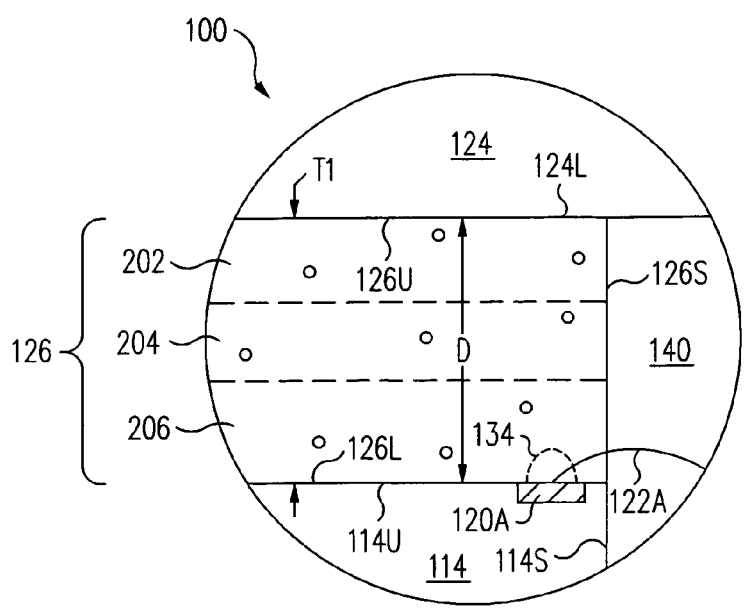
FIG. 2 is an enlarged cross-sectional view of the region II of the stacked electronic component package of FIG. 1 in accordance with one embodiment of the present invention.

In accordance with one embodiment, referring to FIGS. 1 and 2 together, a film-on-wire spacer 126 covers an entire upper surface 114U of a lower electronic component 114. Accordingly, an upper electronic component 124 is supported above bond pads 120 and lower bond wires 122 of lower electronic component 114. This decreases the stress on upper electronic component 124, e.g., during wirebonding, and thus decreases the chance of cracking upper electronic component 124. Further, lower bond wires 122 are enclosed in and protected by film-on-wire spacer 126. Further, film-on-wire spacer 126 is thin resulting in a minimum height of stacked electronic component package 100.

More particularly, FIG. 1 is a cross-sectional view of a stacked electronic component package 100 in accordance with one embodiment of the present invention. Stacked electronic component package 100 includes a substrate 102, e.g., formed of metal, with ceramic, pre-molded plastic or laminate materials, although substrate 102 may be formed of other materials in other embodiments. Substrate 102 includes an upper, e.g., first, surface 102U and a lower, e.g., second, surface 102L, opposite upper surface 102U.

Formed on upper surface 102U of substrate 102 are a plurality of electrically conductive upper, e.g., first, traces 104, which include a first upper trace 104A and a second upper trace 104B. Formed on lower surface 102L of substrate 102 are a plurality of electrically conductive lower, e.g., second, traces 106, which include a first lower trace 106A and a second lower trace 106B. Extending through substrate 102 from lower surface 102L to upper surface 102U are a plurality of electrically conductive vias 108, which include a first via 108A and a second via 108B. Lower traces 106 are electrically connected to upper traces 104 by vias 108. To illustrate, lower traces 106A, 106B are electrically connected to upper traces 104A, 104B by vias 108A, 108B, respectively.

Upper and lower surfaces 102U, 102L of substrate 102 may include an outermost insulative cover coat, e.g., an epoxy based resin, through which electrically conductive bond fingers, e.g., the end portions, of upper traces 104 and pads 110 are exposed.

Formed on lower traces 106 are electrically conductive pads 110, which include a first pad 110A and a second pad 110B. Formed on pads 110 are electrically conductive interconnection balls 112, e.g., solder. To illustrate, pads 110A, 110B are formed on lower traces 106A, 106B, respectively. First and second interconnection balls 112A, 112B of the plurality of interconnection balls 112 are formed on pads 110A, 110B, respectively. Interconnection balls 112 are used to connect stacked electronic component package 100 to a larger substrate such as a printed circuit motherboard or another electronic component package.

Although a particular electrically conductive pathway between upper traces 104 and interconnection balls 112 is described above, other electrically conductive pathways can be formed. For example, contact metallizations can be formed between the various electrical conductors. Alternatively, pads 110 are not formed and interconnection balls 112 are formed directly on lower traces 106.

Further, instead of straight though vias 108, in one embodiment, substrate 102 is a multilayer laminate substrate and a plurality of vias and/or internal traces form the electrical interconnection between traces 104 and 106.

In yet another embodiment, interconnection balls 112 are distributed in an array format to form a ball grid array (BGA) type package. Alternatively, interconnection balls 112 are not formed, e.g., to form a metal land grid array (LGA) type package. In yet another alternative, pads 110/interconnection balls 112 are not formed, e.g., to form a leadless chip carrier (LCC) type package. In another embodiment, stacked electronic component package 100 is inserted into a socket that is pre-mounted on the larger substrate, e.g., on the printed circuit motherboard. BGA, LGA and LCC type modules are well known to those of skill in the art.

In another embodiment, a flex connector, sometimes called an edge connector or flex strip, is electrically connected to lower traces 106, e.g., for applications where stacked electronic component package 100 is remote from the larger substrate. Other electrically conductive pathway modifications will be obvious to those of skill in the art.

Referring still to FIG. 1, mounted, sometimes called die attached, to upper surface 102U of substrate 102 is a lower, e.g., first, electronic component 114. More particularly, a lower, e.g., first, surface 114L of lower electronic component 114 is mounted to upper surface 102U, for example, with an adhesive 116, sometimes called a die attach adhesive or paste adhesive.

Lower electronic component 114 further includes an upper, e.g., second, surface 114U. Bond pads 120 of lower electronic component 114 are formed on upper surface 114U adjacent sides 114S of lower electronic component 114. In this embodiment, upper surface 102U, lower surface 114L, and upper surface 114U are parallel to one another. Although various structures may be described as being parallel or perpendicular, it is understood that the structures may not be exactly parallel or perpendicular but only substantially parallel or perpendicular to within accepted manufacturing tolerances.

In accordance with this embodiment, lower electronic component 114 is a semiconductor die, sometimes called a lower semiconductor die, integrated circuit chip or an active component. However, in other embodiments, lower electronic component 114 is another type of electronic component such as a passive component, e.g., a resistor, capacitor or inductor.

Upper traces 104 are electrically connected to bond pads 120 by lower bond wires 122. To illustrate, a first bond pad 120A of the plurality of bond pads 120 is electrically connected to upper trace 104A by a first lower bond wire 122A of the plurality of lower bond wires 122.

An upper, e.g., second, electronic component 124 is mounted to lower electronic component 114. More particularly, a lower, e.g., first, surface 124L of upper electronic component 124 is mounted to upper surface 114U of lower electronic component 114 with a film-on-wire spacer 126.

In accordance with this embodiment, the total area of lower surface 124L of upper electronic component 124 is greater than, i.e., different than, the total area of upper surface 114U of lower electronic component 114. However, in other embodiments, the total area of lower surface 124L of upper electronic component 124 is less than, i.e., different than, or equal to the total area of upper surface 114U of lower electronic component 114. Such an example is discussed below in reference to FIG. 4.

FIG. 2 is an enlarged cross-sectional view of the region II of stacked electronic component package 100 of FIG. 1 in accordance with one embodiment of the present invention. Referring now to FIGS. 1 and 2 together, film-on-wire spacer 126 includes a lower, e.g., first, surface 126L and an upper, e.g., second, surface 126U.

Lower surface 126L of film-on-wire spacer 126 is directly mounted to upper surface 114U of lower electronic component 114. Generally, film-on-wire spacer 126 is adhesive such that lower surface 126L of film-on-wire spacer 126 directly adheres to upper surface 114U of lower electronic component 114.

Film-on-wire spacer 126 encloses and covers the entire upper surface 114U of lower electronic component 114 including bond pads 120. Further, film-on-wire spacer 126 encloses and covers the portion of lower bond wires 122 vertically between upper surface 114U of lower electronic component 114 and lower surface 124L of upper electronic component 124. Film-on-wire spacer 126 is sufficiently soft and conformable to allow lower bond wires 122 to penetrate into film-on-wire spacer 126, for example, during curing of film-on-wire spacer 126. However, film-on-wire spacer 126 has enough integrity to prevent lower bond wires 122 from making contact to lower surface 124L of upper electronic component 124. Generally film-on-wire spacer 126 is on and encloses lower bond wires 122.

In accordance with this embodiment, film-on-wire spacer 126 is an adhesive film, sometimes called a film adhesive. Generally, film-on-wire spacer 126 is a preformed film of adhesive, e.g., a layer or sheet of adhesive. As such, film-on-wire spacer 126 has sides 126S which are substantially vertical and coincident with sides 114S of lower electronic component 114. In one embodiment, film-on-wire spacer 126 is a preformed layer of epoxy. In contrast, a conventional paste adhesive would be applied as a viscous paste and thus would have curved protruding sides instead of substantially vertical sides 126S of film-on-wire spacer 126. However, in one embodiment, film-on-wire spacer 126 is a film adhesive that flows during the curing process and thus has curved protruding sides.

In one embodiment, instead of having sides 126S which are coincident with sides 114S of lower electronic component 114, film-on-wire spacer 126 is slightly smaller or larger, i.e., different, than lower electronic component 114. Generally, film-on-wire spacer 126 is large enough to at least cover bond pads 120.

In accordance with this embodiment, film-on-wire spacer 126 is a single integral adhesive film, i.e., a single adhesive film and not a plurality of adhesive films bonded to one another. However, in another embodiment, film-on-wire spacer 126 is formed of a plurality of adhesive films bonded to one another as indicated by the dashed lines in FIG. 2 and discussed further below also in reference to FIG. 2.

Similarly, upper surface 126U of film-on-wire spacer 126 is directly mounted to lower surface 124L of upper electronic component 124. As stated above, film-on-wire spacer 126 is adhesive, i.e., sticky, such that upper surface 126U of film-on-wire spacer 126 directly adheres to lower surface 124L of upper electronic component 124.

In accordance with one embodiment, film-on-wire spacer 126 spaces lower surface 124L of upper electronic component 124 a distance above bond pads 120 sufficient to prevent lower bond wires 122 from contacting lower surface 124L of upper electronic component 124.

In accordance with another embodiment, lower bond wires 122 are bonded to bond pads 120 using a reverse bonding technique, sometimes called stand-off stitch bonding (SSB) to minimize the loop height of lower bond wires 122. By minimizing the loop height of lower bond wires 122, the thickness of film-on-wire spacer 126 required to avoid contact between lower bond wires 122 and lower surface 124L of upper electronic component 124 is also minimized.

As is well known to those of skill in the art, in reverse bonding, a ball 134 (indicated as a dashed line in FIG. 2) is initially formed on a bond pad 120 and the wire is broken at the top of ball 134. A similar ball is formed on the respective upper trace 104, sometimes called a bond finger, and lower bond wire 122 is then extended back to ball 134. Lower bond wire 122 is bonded to ball 134 and thus to the bond pad 120 using a standard stitch bond.

Referring now to FIG. 2, in one embodiment, film-on-wire spacer 126 is a multilayer film adhesive. In accordance with this embodiment, film-on-wire spacer 126 includes more than one film adhesive and specifically includes an upper, e.g., first, film adhesive 202, a middle, e.g., second, film adhesive 204, and a lower, e.g., third, film adhesive 206. Upper film adhesive 202 is the uppermost film adhesive and is directly connected to lower surface 124L of upper electronic component 124. Lower film adhesive 206 is the lowermost film adhesive and is directly connected to upper surface 114U of lower electronic component 114U. Middle film adhesive 204 is the middle film adhesive and is between and directly connected to both upper and lower film adhesives 202, 206.

By using three film adhesives 202, 204, 206, the thickness T1 of film-on-wire spacer 126 is greater than the thickness of any of film adhesives 202, 204, 206. Although film-on-wire spacer 126 is illustrated and discussed as including three equivalent thickness film adhesives, i.e., film adhesives 202, 204, 206, it is understood that film-on-wire spacer 126 can be fabricated with three film adhesives having various thickness depending upon the desired distance D between lower surface 124L of upper electronic component 124 and upper surface 114U of lower electronic component 114.

To illustrate, in one embodiment, film-on-wire spacer 126 is fabricated with a lower film adhesive thinner than lower film adhesive 206 to decrease the distance D between lower surface 124L of upper electronic component 124 and upper surface 114U of lower electronic component 114 compared to forming film-on-wire spacer 126 from three film adhesives 202, 204, 206 having equivalent thickness. In this manner, distance D is readily selected by using film adhesives of varying thickness to form film-on-wire spacer 126.

As set forth above, film-on-wire spacer 126 covers the entire upper surface 114U of lower electronic component 114. Accordingly, upper electronic component 124 is supported above bond pads 120 and lower bond wires 122 of lower electronic component 114. This decreases the stress on upper electronic component 124, e.g., during wirebonding, and thus decreases the chance of cracking upper electronic component 124. Further, lower bond wires 122 are enclosed in and protected by film-on-wire spacer 126. Further, film-on-wire spacer 126 is thin resulting in a minimum height of stacked electronic component package 100.

Referring again to FIG. 1, upper electronic component 124 further includes an upper, e.g., second, surface 124U. Bond pads 136 are formed on upper surface 124U of upper electronic component 124. In accordance with this embodiment, upper electronic component 124 is a semiconductor die, sometimes called an upper semiconductor die, integrated circuit chip or an active component. However, in other embodiments, upper electronic component 124 is another type of electronic component such as a passive component, e.g., a resistor, capacitor or inductor.

Upper traces 104 are electrically connected to bond pads 136 by upper bond wires 138. To illustrate, a first bond pad 136A of the plurality of bond pads 136 is electrically connected to upper trace 104B by a first upper bond wire 138A of the plurality of upper bond wires 138.

A package body 140, e.g., a cured liquid encapsulant or mold compound, encloses lower electronic component 114, film-on-wire spacer 126, upper electronic component 124, lower bond wires 122, upper bond wires 138, and all or part of the exposed upper surface 102U of substrate 102.

Figure 3:
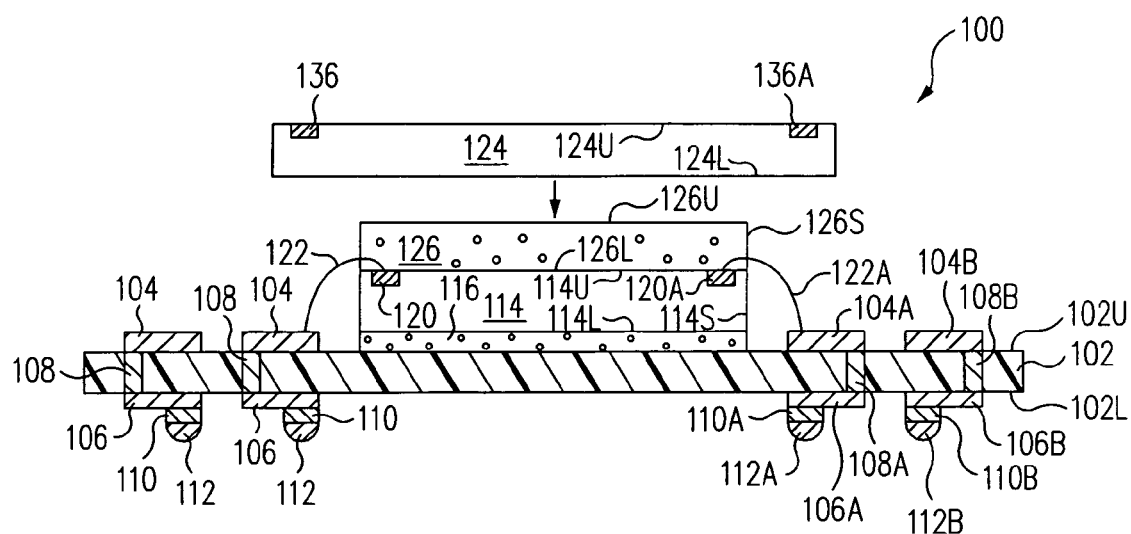
FIG. 3 is a cross-sectional view of the stacked electronic component package of FIG. 1 during fabrication in accordance with one embodiment of the present invention.

FIG. 3 is a cross-sectional view of stacked electronic component package 100 of FIG. 1 during fabrication in accordance with one embodiment of the present invention. Referring now to FIG. 3, lower electronic component 114 is die attached with adhesive 116 to substrate 102. Bond pads 120 are electrically connected to upper traces 104 with lower bond wires 122.

Film-on-wire spacer 126 is placed on and covers the entire upper surface 114U of lower electronic component 114. In one embodiment, film-on-wire spacer 126 is pressed downward on to upper surface 114U of lower electronic component 114 to ensure good adhesion between film-on-wire spacer 126 and upper surface 114U of lower electronic component 114, i.e., to mount film-on-wire spacer 126 to upper surface 114U of lower electronic component 114. Further, during pressing, film-on-wire spacer 126 presses on to lower bond wires 122, which press into film-on-wire spacer 126. In one embodiment, film-on-wire spacer 126 is cured, e.g., thermally, further causing film-on-wire spacer 126 to flow around and envelop lower bond wires 122.

Upper electronic component 124 is pressed into film-on-wire spacer 126 thus mounting upper electronic component 124 to film-on-wire spacer 126.

Referring again to FIG. 1, to complete fabrication of stacked electronic component package 100, bond pads 136 are electrically connected to respective lower traces 104 by upper bond wires 138. Film-on-wire spacer 126 supports upper electronic component 124 during bonding of upper bond wires 138 to bond pads 136. Lower electronic component 114, film-on-wire spacer 126, upper electronic component 124, lower bond wires 122, upper bond wires 138, and all or part of the exposed upper surface 102U of substrate 102 are enclosed in liquid encapsulant or mold compound using any one of the number of encapsulation/molding techniques to form package body 140. Interconnection balls 112, e.g., solder balls, are formed on pads 110 thus completing fabrication of stacked electronic component package 100 although interconnection balls 112 are formed at earlier stages during the manufacturing process in other embodiments.

In another embodiment, film-on-wire spacer 126, e.g., formed of film adhesives 202, 204, 206 as shown in FIG. 2, is placed on and covers the entire lower surface 124L of upper electronic component 124. Illustratively, a sheet of three film adhesives is applied to the lower surface of a wafer having a plurality of upper electronic components 124. The sheet of three film adhesives is singulated during singulation of upper electronic component 124 from the wafer thus forming film-on-wire spacer 126 connected to and covering the entire lower surface 124L of upper electronic component 124.

In one embodiment, upper electronic component 124 and thus film-on-wire spacer 126 is pressed downward on to upper surface 114U of lower electronic component 114 to ensure good adhesion between film-on-wire spacer 126 and upper surface 114U of lower electronic component 114. Further, during pressing, film-on-wire spacer 126 presses on to lower bond wires 122, which press into film-on-wire spacer 126. Film-on-wire spacer 126 has enough integrity to prevent lower bond wires 122 from making contact to lower surface 124L of upper electronic component 124. In one embodiment, film-on-wire spacer 126 is cured, e.g., thermally, further causing film-on-wire spacer 126 to flow around and envelop lower bond wires 122.

Figure 4:
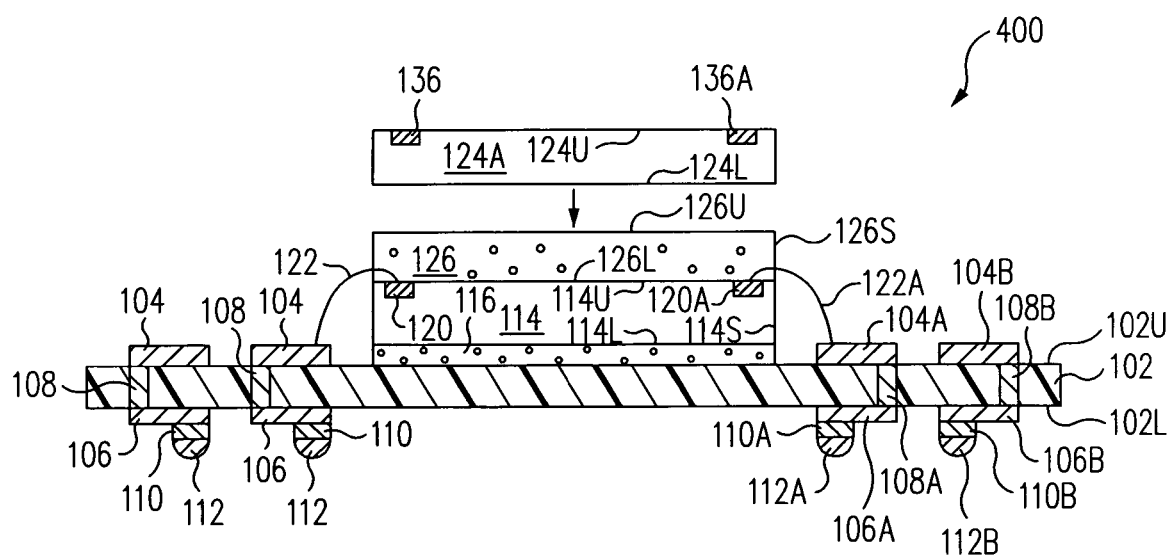
FIG. 4 is a cross-sectional view of a stacked electronic component package during fabrication in accordance with one embodiment of the present invention.

FIG. 4 is a cross-sectional view of a stacked electronic component package 400 during fabrication in accordance with one embodiment of the present invention. Stacked electronic component package 400 of FIG. 4, including fabrication thereof, is similar to stacked electronic component package 100 of FIG. 3, including fabrication thereof, and only the significant differences between stacked electronic component package 400 and stacked electronic component package 100, including fabrication thereof, are discussed below.

Referring now to FIG. 4, in accordance with this embodiment, an upper electronic component 124A is the same size as lower electronic component 114. Accordingly, upper electronic component 124A does not overhang sides 114S of lower electronic component 114. Stated another way, lower surface 124L of upper electronic component 124A is the same size as upper surface 114U of lower electronic component 114 such that the total surface area of lower surface 124L is equal to the total surface area of upper surface 114U.

In accordance with this embodiment, after film-on-wire spacer 126 is mounted to upper surface 114U of lower electronic component 114, lower surface 124L of upper electronic component 124A is pressed into film-on-wire spacer 126.

Film-on-wire spacer 126 is mounted to the entire lower surface 124L of upper electronic component 124A. Specifically, film-on-wire spacer 126 is attached to lower surface 124L of upper electronic component 124A beneath bond pads 136 of upper electronic component 124A. Thus, film-on-wire spacer 126 supports upper electronic component 124A during bonding of the upper bond wires to bond pads 136. Completion of fabrication of stacked electronic component package 400 is substantially similar to completion of fabrication of stacked electronic package 100 as discussed above and so is not repeated here.

Figure 5:
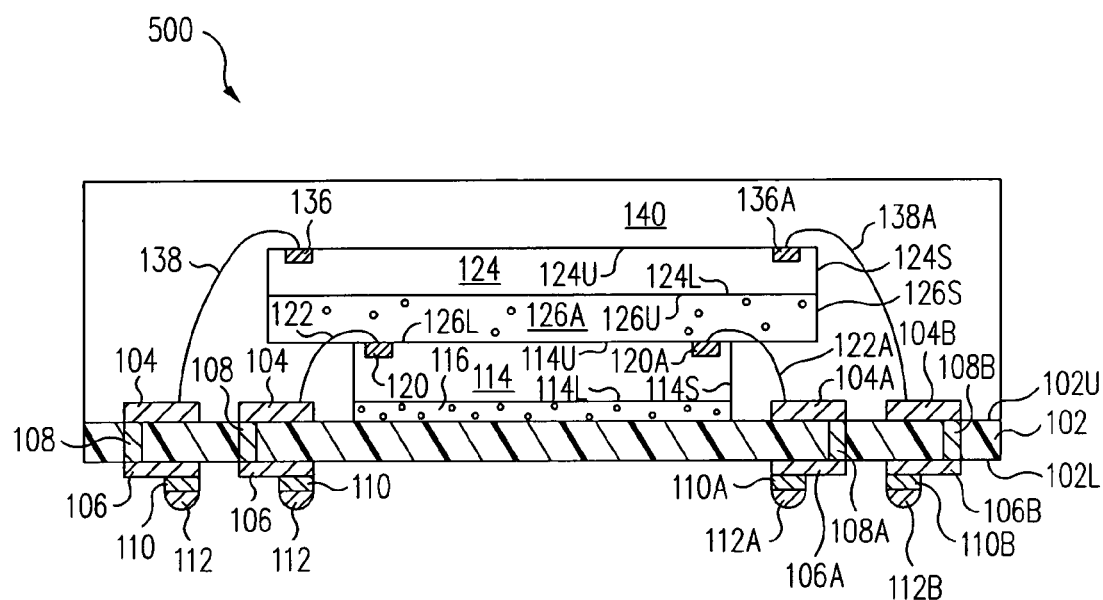
FIG. 5 is a cross-sectional view of a stacked electronic component package in accordance with one embodiment of the present invention.

FIG. 5 is a cross-sectional view of a stacked electronic component package 500 in accordance with one embodiment of the present invention. Stacked electronic component package 500 of FIG. 5 is similar to stacked electronic component package 100 of FIG. 1 and only the significant differences between stacked electronic component package 500 and stacked electronic component package 100 are discussed below.

Referring now to FIG. 5, in accordance with this embodiment, film-on-wire spacer 126A is the same size as upper electronic component 124 and covers the entire lower surface 124L of upper electronic component 124. As such, film-on-wire spacer 126A has sides 126S which are substantially vertical and coincident with sides 124S of upper electronic component 124. Accordingly, film-on-wire spacer 126A overhangs sides 114S of lower electronic component 114. Stated another way, lower surface 124L of upper electronic component 124 is the same size as upper surface 126U of film-on-wire spacer 126A such that the total surface area of lower surface 124L is equal to the total surface area of upper surface 126U.

Although upper electronic component 124 and film-on-wire spacer 126A are discussed and illustrated as being larger than lower electronic component 114, in other embodiments, upper electronic component 124 and film-on-wire spacer 126A are larger or smaller, i.e., different, than lower electronic component 114.

Figure 6:
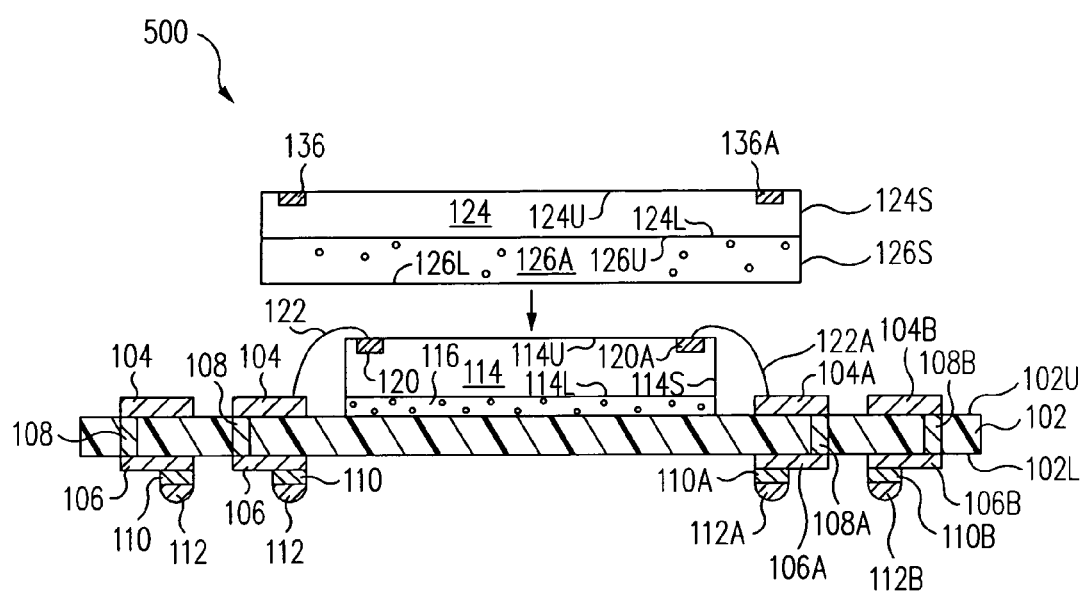
FIG. 6 is a cross-sectional view of the stacked electronic component package of FIG. 5 during fabrication in accordance with one embodiment of the present invention.

FIG. 6 is a cross-sectional view of stacked electronic component package 500 of FIG. 5 during fabrication in accordance with one embodiment of the present invention. Referring now to FIG. 6, lower electronic component 114 is die attached with adhesive 116 to substrate 102. Bond pads 120 are electrically connected to upper traces 104 with lower bond wires 122.

Film-on-wire spacer 126A is placed on and covers the entire lower surface 124L of upper electronic component 124. Illustratively, a sheet of film adhesive is applied to the lower surface of a wafer having a plurality of upper electronic components 124. The sheet of film adhesive is singulated during singulation of upper electronic component 124 from the wafer thus forming film-on-wire spacer 126A connected to and covering the entire lower surface 124L of upper electronic component 124.

In one embodiment, upper electronic component 124 and thus film-on-wire spacer 126A is pressed downward on to upper surface 114U of lower electronic component 114 to ensure good adhesion between film-on-wire spacer 126A and upper surface 114U of lower electronic component 114. Further, during pressing, film-on-wire spacer 126A presses on to lower bond wires 122, which press into film-on-wire spacer 126A. Film-on-wire spacer 126A has enough integrity to prevent lower bond wires 122 from making contact to lower surface 124L of upper electronic component 124. In one embodiment, film-on-wire spacer 126A is cured, e.g., thermally, further causing film-on-wire spacer 126A to flow around and envelop lower bond wires 122.

Referring again to FIG. 5, to complete fabrication of stacked electronic component package 500, bond pads 136 are electrically connected to respective lower traces 104 by upper bond wires 138. Film-on-wire spacer 126A supports upper electronic component 124 during bonding of upper bond wires 138 to bond pads 136. Lower electronic component 114, film-on-wire spacer 126A, upper electronic component 124, lower bond wires 122, upper bond wires 138, and all or part of the exposed upper surface 102U of substrate 102 are enclosed in liquid encapsulant or mold compound using any one of the number of encapsulation/molding techniques to form package body 140. Interconnection balls 112, e.g., solder balls, are formed on pads 110 thus completing fabrication of stacked electronic component package 100 although interconnection balls 112 are formed at earlier stages during the manufacturing process in other embodiments.

Figure 7:
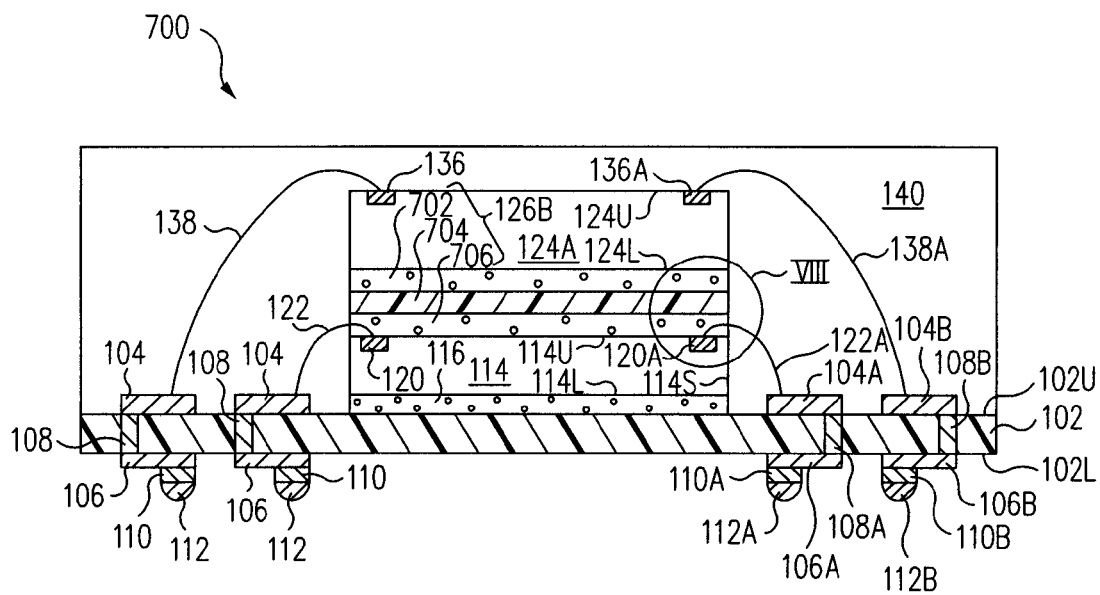
FIG. 7 is a cross-sectional view of a stacked electronic component package in accordance with one embodiment of the present invention.

FIG. 7 is a cross-sectional view of a stacked electronic component package 700 in accordance with one embodiment of the present invention. Stacked electronic component package 700 of FIG. 7 is similar to stacked electronic component package 100 of FIG. 1 and only the significant differences between stacked electronic component package 700 and stacked electronic component package 100 are discussed below.

Figure 8:
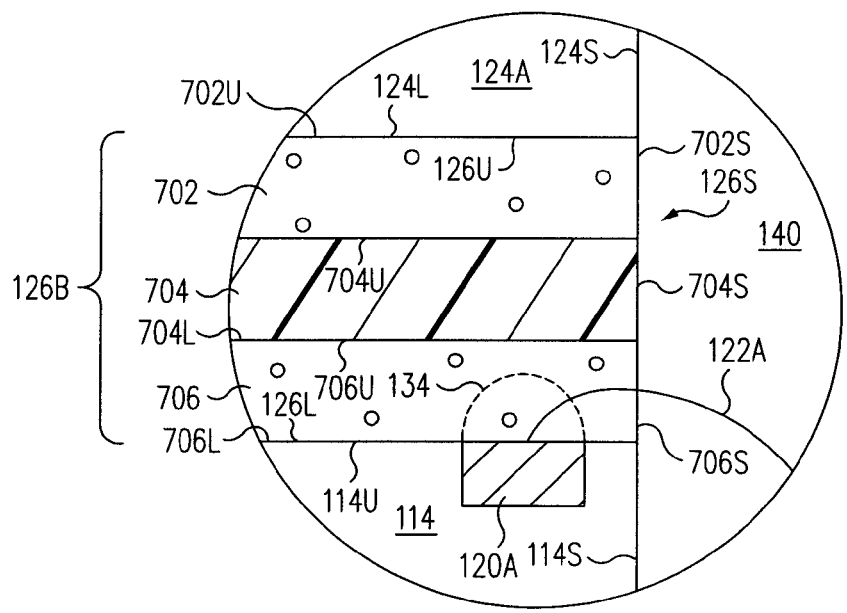
FIG. 8 is an enlarged cross-sectional view of a region VIII of the stacked electronic component package of FIG. 7 in accordance with one embodiment of the present invention.

FIG. 8 is an enlarged cross-sectional view of the region VIII of stacked electronic component package 700 of FIG. 7 in accordance with one embodiment of the present invention. Referring now to FIGS. 7 and 8 together, a film-on-wire spacer 126B includes an upper film adhesive 702, a spacer 704, and a lower film adhesive 706. Spacer 704, sometimes called a film, is a nonconductive, nonadhesive, flexible film in one embodiment. In one embodiment, spacer 704 is formed of polyimide, e.g., is a polyimide film. Accordingly, in accordance with this embodiment, spacer 704 is an organic film. Spacer 704 includes a lower, e.g., first, surface 704L, an upper, e.g., second, surface 704U, and sides 704S extending between upper surface 704U and lower surface 704L. In another embodiment, spacer 704 is adhesive, e.g., film or epoxy adhesive.

Lower surface 704L of spacer 704 is directly mounted to upper surface 114U of lower electronic component 114 with lower film adhesive 706. More particularly, a lower, e.g., first, surface 706L of lower film adhesive 706 is mounted to and covers the entire upper surface 114U of lower electronic component 114. Generally, lower film adhesive 706, sometimes called a spacer film adhesive, is adhesive such that lower surface 706L of lower film adhesive 706 directly adheres to upper surface 114U of lower electronic component 114.

Similarly, an upper, e.g., second, surface 706U of lower film adhesive 706 is mounted to lower surface 704L of spacer 704. Again, lower film adhesive 706 is adhesive such that upper surface 706U of lower film adhesive 706 directly adheres to lower surface 704L of spacer 704.

In accordance with this embodiment, lower film adhesive 706 is an adhesive film, sometimes called a film adhesive. Generally, lower film adhesive 706 is a preformed film of adhesive, e.g., a layer or sheet of adhesive. As such, lower film adhesive 706 has sides 706S which are substantially vertical and coincident with sides 704S of spacer 704. In one embodiment, lower film adhesive 706 is a preformed layer of epoxy.

Upper film adhesive 702, sometimes called a second electronic component film adhesive, is mounted to and covers the entire lower surface 124L of upper electronic component 124A. Generally, upper film adhesive 702 is adhesive such that an upper, e.g., first, surface 702U of upper film adhesive 702 directly adheres to lower surface 124L of upper electronic component 124A.

In accordance with this embodiment, upper film adhesive 702 is an adhesive film, sometimes called a film adhesive. Generally, upper film adhesive 702 is a preformed film of adhesive, e.g., a layer or sheet of adhesive. As such, upper film adhesive 702 has sides 702S which are substantially vertical and coincident with sides 124S of upper electronic component 124A. In one embodiment, upper film adhesive 702 is a preformed layer of epoxy.

Upper electronic component 124A is the same size as lower electronic component 114. Accordingly, upper electronic component 124A does not overhang sides 114S of lower electronic component 114. Stated another way, lower surface 124L of upper electronic component 124A is the same size as upper surface 114U of lower electronic component 114 such that the total surface area of lower surface 124L is equal to the total surface area of upper surface 114U. In accordance with this embodiment, sides 124S, 702S, 704S, 706S, 114S are substantially vertical and coincident with one another.

Film-on-wire spacer 126B and specifically lower film adhesive 706 covers the entire upper surface 114U of lower electronic component 114. Further, film-on-wire spacer 126B covers the entire lower surface 124L of upper electronic component 124A directly beneath bond pads 136 of upper electronic component 124A. Thus, film-on-wire spacer 126B supports upper electronic component 124A during bonding of upper bond wires 138 to bond pads 136. This decreases the stress on upper electronic component 124A, e.g., during wirebonding, and thus decreases the chance of cracking upper electronic component 124A. Further, lower bond wires 122 are enclosed in and protected by lower film adhesive 706. Further, film-on-wire spacer 126B is thin resulting in a minimum height of stacked electronic component package 700.

In other embodiments, instead of being the same size as lower electronic component 114, upper electronic component 124A is larger or smaller, i.e., different, than lower electronic component 114. Similarly, in other embodiments, instead of being the same size as lower electronic component 114, film-on-wire spacer 126B is larger or smaller, i.e., different, than lower electronic component 114.

In one embodiment, upper film adhesive 702 is formed out of the same type of film adhesive as lower film adhesive 706.

In another embodiment, upper film adhesive 702 is formed out of a first type of film adhesive and lower film adhesive 706 is formed out of a second different type of film adhesive. For example, upper film adhesive 702 is strongly adhesive, sometimes called sticky, to facilitate mounting of lower surface 124L of upper electronic component 124A to upper surface 702U of upper film adhesive 702. In contrast, lower film adhesive 706 is extremely compliant and soft, sometimes called having a high wetability, e.g., has a low viscosity, to facilitate penetration of lower bond wires 122 into lower film adhesive 706. Generally, upper film adhesive 702 has a greater adhesiveness than lower film adhesive 706 and lower film adhesive 706 is more compliant, e.g., has a lower viscosity, sometimes called a high flow, than upper film adhesive 702.

In one embodiment, during fabrication of stacked electronic component package 700, film-on-wire spacer 126B is placed on and covers the entire upper surface 114U of lower electronic component 114. In one embodiment, film-on-wire spacer 126B is pressed downward on to upper surface 114U of lower electronic component 114 to ensure good adhesion between film-on-wire spacer 126B and upper surface 114U of lower electronic component 114, i.e., to mount film-on-wire spacer 126B to upper surface 114U of lower electronic component 114. Further, during pressing, film-on-wire spacer 126B presses on to lower bond wires 122, which press into lower film adhesive 706 of film-on-wire spacer 126B. In one embodiment, film-on-wire spacer 126B is cured, e.g., thermally, further causing lower film adhesive 706 of film-on-wire spacer 126 to flow around and envelop lower bond wires 122.

Upper electronic component 124A is pressed into film-on-wire spacer 126B thus mounting upper electronic component 124A to film-on-wire spacer 126B.

In another embodiment, film-on-wire spacer 126B is placed on and covers the entire lower surface 124L of upper electronic component 124A. Illustratively, a sheet is applied to the lower surface of a wafer having a plurality of upper electronic components 124A. The sheet is singulated during singulation of upper electronic component 124A from the wafer thus forming film-on-wire spacer 126B connected to and covering the entire lower surface 124L of upper electronic component 124A.

In one embodiment, upper electronic component 124A and thus film-on-wire spacer 126B is pressed downward on to upper surface 114U of lower electronic component 114 to ensure good adhesion between film-on-wire spacer 126B and upper surface 114U of lower electronic component 114. Further, during pressing, lower film adhesive 706 of film-on-wire spacer 126B presses on to lower bond wires 122, which press into lower film adhesive 706. In one embodiment, film-on-wire spacer 126B is cured, e.g., thermally, further causing lower film adhesive 706 of film-on-wire spacer 126B to flow around and envelop lower bond wires 122.

Figure 9:
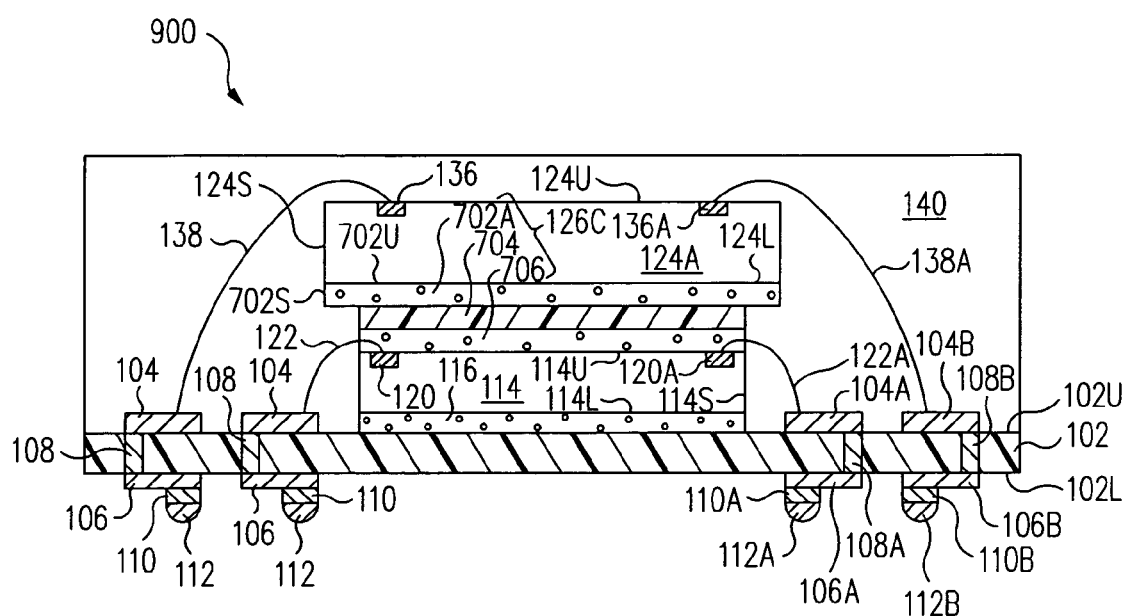
FIG. 9 is a cross-sectional view of a stacked electronic component package in accordance with one embodiment of the present invention.

FIG. 9 is a cross-sectional view of a stacked electronic component package 900 in accordance with one embodiment of the present invention. Stacked electronic component package 900 of FIG. 9 is similar to stacked electronic component package 700 of FIG. 7 and only the significant differences between stacked electronic component package 900 and stacked electronic component package 700 are discussed below.

In accordance with this embodiment, a film-on-wire spacer 126C includes an upper film adhesive 702A, spacer 704, and lower film adhesive 706. In one embodiment, spacer 704 is a rigid spacer, e.g., a silicon spacer.

The total area of lower surface 124L of upper electronic component 124 is greater than the total area of upper surface 114U of lower electronic component 114. Upper film adhesive 702A is the same size as upper electronic component 124 and covers the entire lower surface 124L of upper electronic component 124. As such, upper film adhesive 702A has sides 702S which are substantially vertical and coincident with sides 124S of upper electronic component 124. Accordingly, upper film adhesive 702A overhangs sides 114S of lower electronic component 114. Stated another way, lower surface 124L of upper electronic component 124 is the same size as upper surface 702U of upper film adhesive 702A such that the total surface area of lower surface 124L is equal to the total surface area of upper surface 702U.

Illustratively, a sheet of film adhesive is applied to the lower surface of a wafer having a plurality of upper electronic components 124. The sheet of film adhesive is singulated during singulation of upper electronic component 124 from the wafer thus forming upper film adhesive 702A connected to and covering the entire lower surface 124L of upper electronic component 124.

Figure 10:
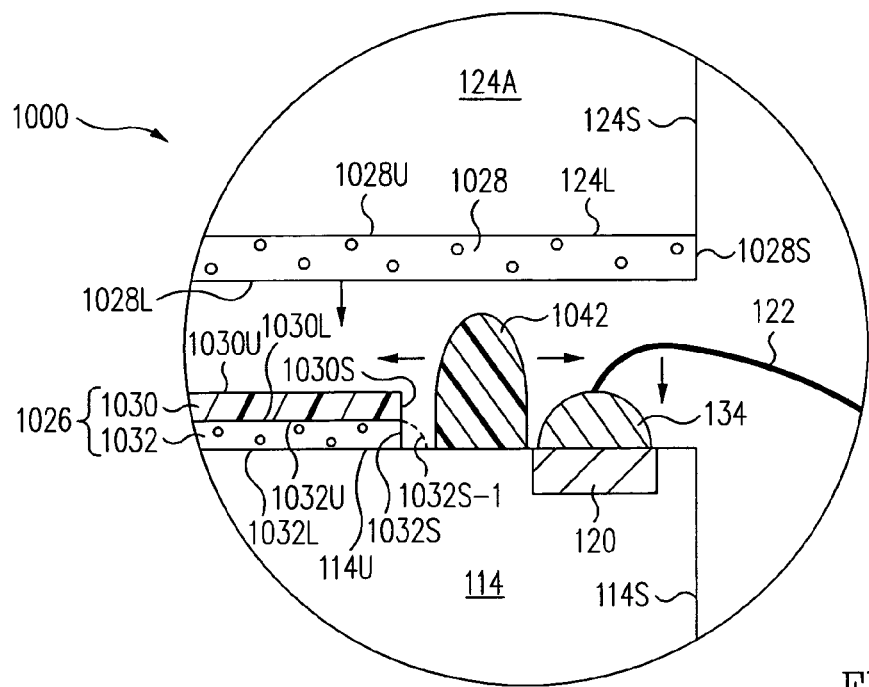
FIG. 10 is an enlarged cross-sectional view of a region of a stacked electronic component package during fabrication in accordance with one embodiment of the present invention.

FIG. 10 is an enlarged cross-sectional view of a region of a stacked electronic component package 1000 during fabrication in accordance with one embodiment of the present invention. Stacked electronic component package 1000 includes a single-sided film spacer 1026, sometimes called an inner spacer assembly, includes a spacer 1030 and a lower adhesive 1032. Spacer 1030, sometimes called a film, is a nonconductive, nonadhesive, flexible film. In one embodiment, spacer 1030 is formed of polyimide, e.g., is a polyimide film. Accordingly, in accordance with this embodiment, spacer 1030 is an organic film. Spacer 1030 includes a lower, e.g., first, surface 1030L, an upper, e.g., second, surface 1030U, and sides 1030S extending between upper surface 1030U and lower surface 1030L. In another embodiment, spacer 1030 is a rigid spacer, e.g., a silicon spacer.

Lower surface 1030L of spacer 1030 is directly mounted to upper surface 114U of lower electronic component 114 with lower adhesive 1032 inward of bond pads 120. More particularly, a lower, e.g., first, surface 1032L of lower adhesive 1032 is mounted to upper surface 114U of lower electronic component 114 inward of bond pads 120. Generally, lower adhesive 1032, sometimes called a spacer film adhesive, is adhesive such that lower surface 1032L of lower adhesive 1032 directly adheres to upper surface 114U of lower electronic component 114.

Similarly, an upper, e.g., second, surface 1032U of lower adhesive 1032 is mounted to lower surface 1030L of spacer 1030. Again, lower adhesive 1032 is adhesive such that upper surface 1032U of lower adhesive 1032 directly adheres to lower surface 1030L of spacer 1030.

In accordance with one embodiment, lower adhesive 1032 is an adhesive film, sometimes called a film adhesive. For example, lower adhesive 1032 is a preformed film of adhesive, e.g., a layer or sheet of adhesive. As such, lower adhesive 1032 has sides 1032S which are substantially vertical and coincident with sides 1030S of spacer 1030. In one embodiment, lower adhesive 1032 is a preformed layer of epoxy.

However, as indicated by the dashed line 1032S-1, in one embodiment, lower adhesive 1032 is a paste adhesive applied as a viscous paste. In accordance with this alternative embodiment, lower adhesive 1032 has curved protruding sides as indicated by the dashed line 1032S-1 instead of substantially vertical sides 1032S.

Lower bond wires 122 are bonded to bond pads 120 using a reverse bonding technique, sometimes called stand-off stitch bonding (SSB) to minimize the loop height of lower bond wires 122. In another embodiment, ultra-low loop forward bonding is used to minimize the loop height of lower bond wires 122.

As is well known to those of skill in the art, in reverse bonding, a ball 134 is initially formed on a bond pad 120 and the wire is broken at the top of ball 134. A similar ball is formed on the respective upper trace 104, sometimes called a bond finger, and lower bond wire 122 is then extended back to ball 134. Lower bond wire 122 is bonded to ball 134 and thus to bond pads 120 using a standard stitch bond.

Upper film adhesive 1028, sometimes called a second electronic component film adhesive, is mounted to and covers the entire lower surface 124L of upper electronic component 124A. Generally, upper film adhesive 1028 is adhesive such that an upper, e.g., first, surface 1028U of upper film adhesive 1028 directly adheres to lower surface 124L of upper electronic component 124A.

In accordance with this embodiment, upper film adhesive 1028 is an adhesive film, sometimes called a film adhesive. Generally, upper film adhesive 1028 is a preformed film of adhesive, e.g., a layer or sheet of adhesive. As such, upper film adhesive 1028 has sides 1028S which are substantially vertical and coincident with sides 124S of upper electronic component 124A. In one embodiment, upper film adhesive 1028 is a preformed layer of epoxy.

In accordance with this embodiment, upper film adhesive 1028 is nonconductive, i.e., a dielectric. Upper film adhesive 1028 is located vertically above bond pads 120/lower bond wires 122. More particularly, upper film adhesive 1028 is located vertically between bond pads 120/lower bond wires 122 and lower surface 124L of upper electronic component 124A.

An adhesive bead 1042 is applied, e.g., as a viscous paste, to upper surface 114U of lower electronic component 114 around single-sided film spacer 1026, e.g., from a needle dispenser. Adhesive bead 1042 extends to a height above upper surface 114U greater than the height of single-sided film spacer 1026 above upper surface 114U.

In accordance with this embodiment, adhesive bead 1042 is applied to upper surface 114U between single-sided film spacer 1026 and bond pads 120.

However, in another embodiment, adhesive bead 1042 is applied partially or totally on bond pads 120 and balls 134. In yet another embodiment, adhesive bead 1042 is not applied and the remaining air gap is filled with an epoxy mold compound during the molding process.

Upper electronic component 124A including upper film adhesive 1028 is positioned above lower electronic component 114 as shown in FIG. 10. Upper electronic component 124A is pressed downwards towards lower electronic component 114. This causes upper film adhesive 1028, and more particularly, a lower, e.g., second, surface 1028L of upper film adhesive 1028, to pressed downwards on adhesive bead 1042, i.e., squeeze adhesive bead 1042, which spreads between upper film adhesive 1028 and upper surface 114U of lower electronic component 114. Further, upper film adhesive 1028 presses downwards on lower bond wires 122.

Upper film adhesive 1028 protects lower surface 124L of upper electronic component 124A from lower bond wires 122 and vice versa. More particularly, upper film adhesive 1028 prevents lower bond wires 122 from directly contacting and shorting to lower surface 124L.

Figure 11:
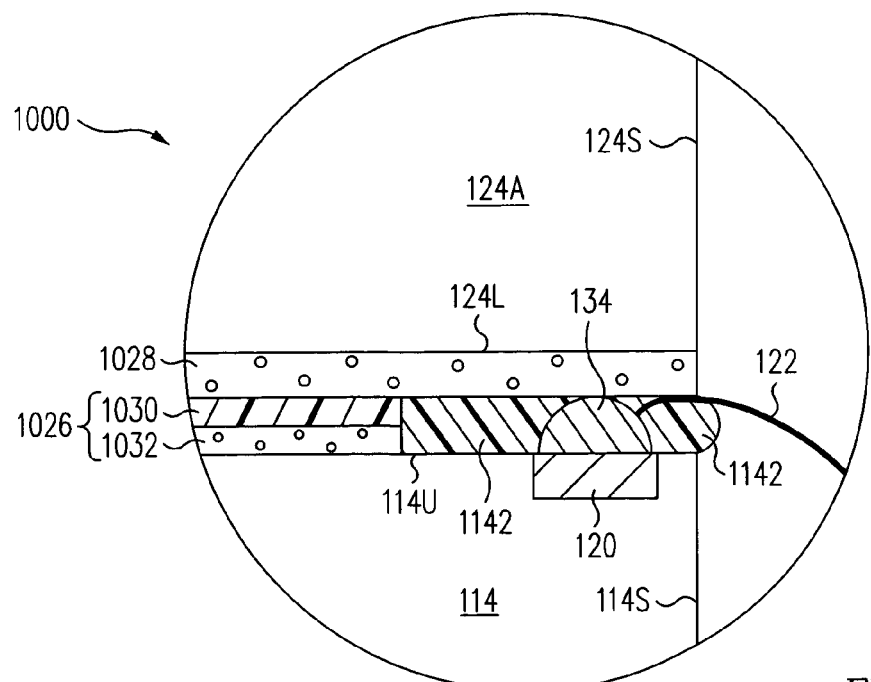
FIG. 11 is a cross-sectional view of the region of the stacked electronic component package of FIG. 10 at a later stage during fabrication in accordance with one embodiment of the present invention.

FIG. 11 is a cross-sectional view of the region of stacked electronic component package 1000 of FIG. 10 at a later stage during fabrication in accordance with one embodiment of the present invention. Referring now to FIGS. 10 and 11 together, upper electronic component 124A is moved downwards towards lower electronic component 114 until upper film adhesive 1028 contacts spacer 1030 of single-sided film spacer 1026 as shown in FIG. 11. Upper film adhesive 1028 is adhesive and thus adhesively bonds to single-sided film spacer 1026.

Further, adhesive bead 1042 fills the region around single-sided films spacer 1026 and between upper film adhesive 1028 and upper surface 114U of lower electronic component 114 and is cured, if necessary, thus forming a nonconductive electronic component filler 1142 as illustrated in FIG. 11. Specifically, adhesive bead 1042 is squeezed to cover bond pads 120 and lower bond wires 122 such that electronic component filler 1142 encloses single-sided film spacer 1026, covers bond pads 120 and lower bond wires 122, and completely fills the region between upper surface 114U of lower electronic component 114 and upper film adhesive 1028. Completion of fabrication of stacked electronic component package 1000 is similar to fabrication of electronic component package 100 of FIG. 1 and so is not repeated here.

As set forth above, film-on-wire spacer 1026 in combination with electronic component filler 1142 covers the entire upper surface 114U of lower electronic component 114. Accordingly, upper electronic component 124A is supported above bond pads 120 and lower bond wires 122 of lower electronic component 114. This decreases the stress on upper electronic component 124A, e.g., during wirebonding, and thus decreases the chance of cracking upper electronic component 124A. Further, lower bond wires 122 are enclosed in and protected by electronic component filler 1142. This avoids shorting of lower bond wires 122 and/or failure of the bond between bond pads 120 and lower bond wires 122. Further, film-on-wire spacer 1026 is thin resulting in a minimum height of stacked electronic component package 1000.

Figure 12:
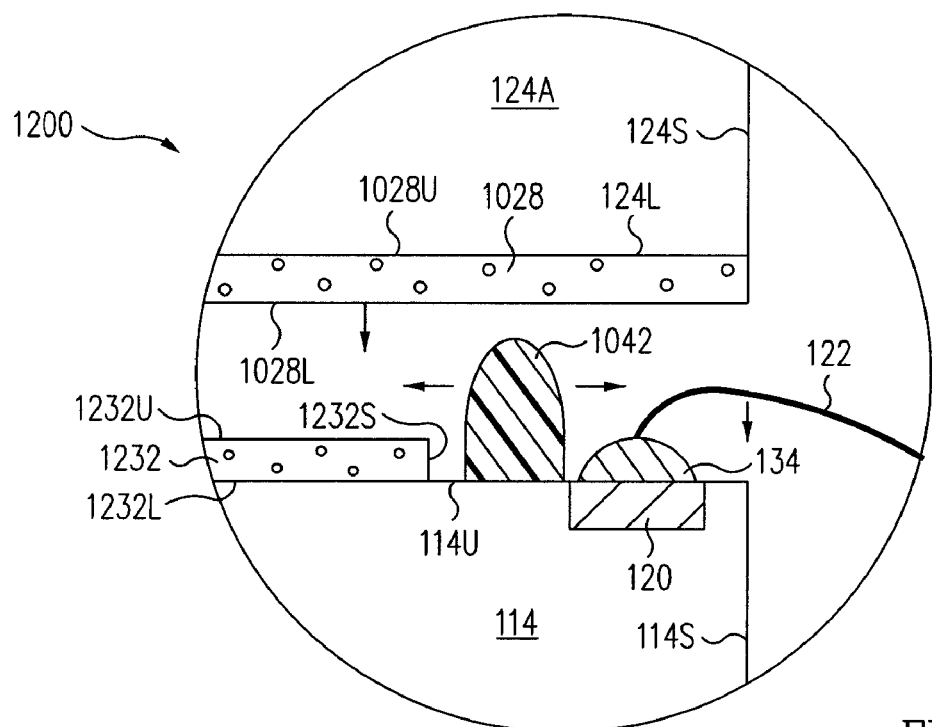
FIG. 12 is an enlarged cross-sectional view of a region of a stacked electronic component package during fabrication in accordance with one embodiment of the present invention.

FIG. 12 is an enlarged cross-sectional view of a region of a stacked electronic component package 1200 during fabrication in accordance with one embodiment of the present invention. Stacked electronic component package 1200 of FIG. 12 is similar to stacked electronic component package 1000 of FIG. 10 except that stacked electronic component package 1200 of FIG. 12 includes a lower film adhesive 1232 instead of a single-sided film spacer 1026.

Referring now to FIG. 12, lower film adhesive 1232, sometimes called an inner spacer assembly, is mounted to upper surface 114U of lower electronic component 114 inward of bond pads 120. Generally, lower film adhesive 1232 is adhesive such that a lower, e.g., first, surface 1232L of lower film adhesive 1232 directly adheres to upper surface 114U of lower electronic component 114.

In accordance with this embodiment, lower film adhesive 1232 is an adhesive film, sometimes called a film adhesive. Generally, lower film adhesive 1232 is a preformed film of adhesive, e.g., a layer or sheet of adhesive. As such, lower film adhesive 1232 has sides 1232S which are substantially vertical. In one embodiment, lower film adhesive 1232 is a preformed layer of epoxy.

Adhesive bead 1042 is applied to upper surface 114U of lower electronic component 114 around lower film adhesive 1232 in a manner similar to that discussed above with reference to FIG. 10.

Figure 13:
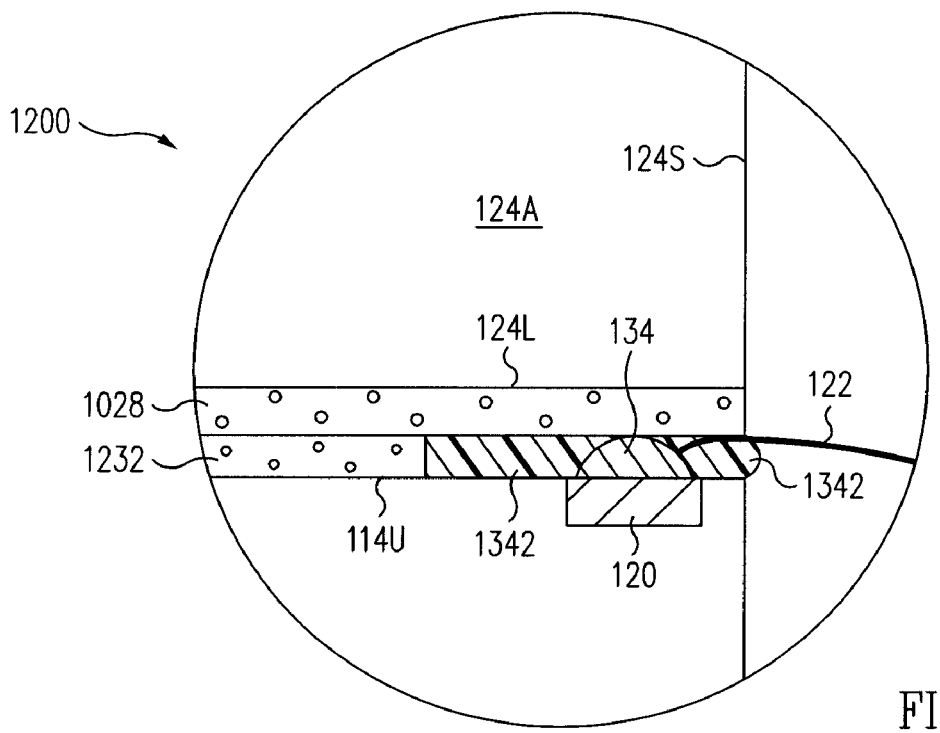
FIG. 13 is an enlarged cross-sectional view of the region of the stacked electronic component package of FIG. 12 at a later stage during fabrication in accordance with one embodiment of the present invention.

FIG. 13 is an enlarged cross-sectional view of the region of stacked electronic component package 1200 of FIG. 12 at a later stage during fabrication in accordance with one embodiment of the present invention. Referring now to FIGS. 12 and 13 together, upper electronic component 124A is moved downwards towards lower electronic component 114 until upper film adhesive 1028 contacts lower film adhesive 1232, and more particularly, an upper, e.g., second surface 1232U of lower film adhesive 1232, as shown in FIG. 13.

Upper film adhesive 1028 and lower film adhesive 1232 are adhesive and thus adhesively bond to one another. Further, adhesive bead 1042 fills the region around lower film adhesive 1232 and between upper film adhesive 1028 and upper surface 114U of lower electronic component 114 and is cured, if necessary, thus forming an electronic component filler 1342 as illustrated in FIG. 13. Specifically, adhesive bead 1042 is squeezed to cover bond pads 120 and lower bond wires 122 such that electronic component filler 1342 encloses lower film adhesive 1232, covers bond pads 120 and lower bond wires 122, and completely fills the region between upper surface 114U of lower electronic component 114 and upper film adhesive 1028. Completion of fabrication of stacked electronic component package 1200 is similar to fabrication of electronic component package 100 of FIG. 1 and so is not repeated here.

Figure 14:
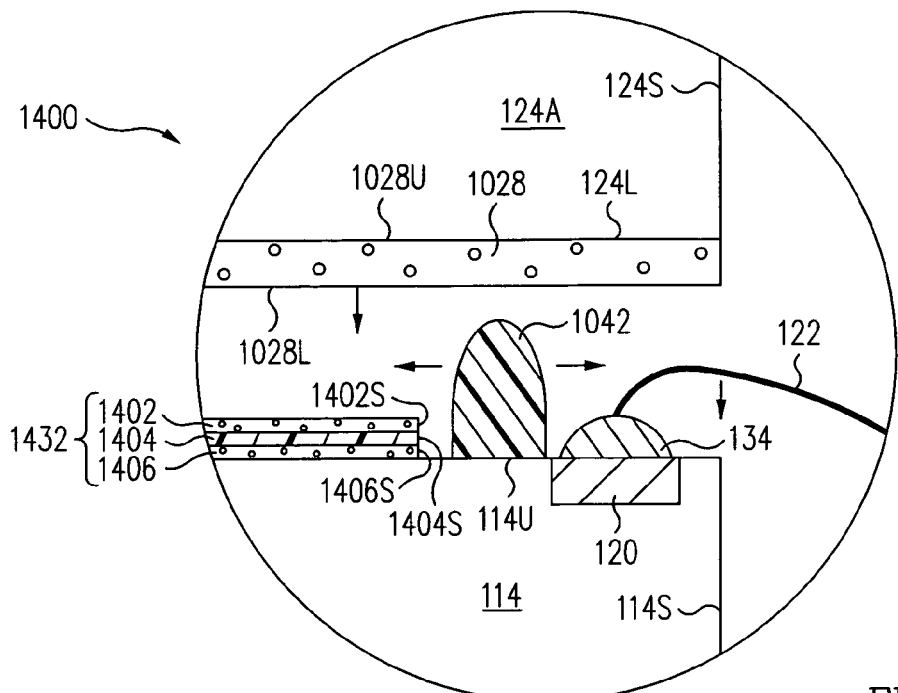
FIG. 14 is an enlarged cross-sectional view of a region of a stacked electronic component package during fabrication in accordance with one embodiment of the present invention.

FIG. 14 is an enlarged cross-sectional view of a region of a stacked electronic component package 1400 during fabrication in accordance with one embodiment of the present invention. Stacked electronic component package 1400 of FIG. 14 is similar to stacked electronic component package 1000 of FIG. 10 except that stacked electronic component package 1400 of FIG. 14 includes a double-sided film spacer 1432 instead of a single-sided film spacer 1026.

Referring now to FIG. 14, double-sided film spacer 1432, sometimes called an inner spacer assembly, includes an upper adhesive 1402, a spacer 1404, and a lower adhesive 1406. In one embodiment, spacer 1404, sometimes called a film, is a nonconductive, nonadhesive, flexible film. In one embodiment, spacer 1404 is formed of polyimide, e.g., is a polyimide film. In accordance with this embodiment, spacer 1404 is an organic film. However, in another embodiment, spacer 1404 is a rigid spacer, e.g., a silicon spacer. In another embodiment, spacer 1404 is adhesive, e.g., film or epoxy adhesive.

Spacer 1404 is directly mounted to upper surface 114U of lower electronic component 114 inward of bond pads 120 with lower adhesive 1406. Generally, lower adhesive 1406, sometimes called a spacer adhesive, is adhesive such that lower adhesive 1406 directly adheres to upper surface 114U of lower electronic component 114.

Similarly, lower adhesive 1406 is mounted to spacer 1404. Again, lower adhesive 1406 is adhesive such that lower adhesive 1406 directly adheres to spacer 1404.

In accordance with one embodiment, lower adhesive 1406 is an adhesive film, sometimes called a film adhesive. Generally, lower adhesive 1406 is a preformed film of adhesive, e.g., a layer or sheet of adhesive. As such, lower adhesive 1406 has sides 1406S which are substantially vertical and coincident with sides 1404S of spacer 1404. In one embodiment, lower adhesive 1406 is a preformed layer of epoxy.

However, in another embodiment, lower adhesive 1406 is a paste adhesive applied as a viscous paste. In accordance with this alternative embodiment, lower adhesive 1406 would have curved protruding sides instead of substantially vertical sides 1406S.

Upper adhesive 1402 is mounted to spacer 1404. Generally, upper adhesive 1402 is adhesive such that upper adhesive 1402 directly adheres to spacer 1404.

In accordance with one embodiment, upper adhesive 1402 is an adhesive film, sometimes called a film adhesive. Generally, upper adhesive 1402 is a preformed film of adhesive, e.g., a layer or sheet of adhesive. As such, upper adhesive 1402 has sides 1402S which are substantially vertical and coincident with sides 1404S of spacer 1404. In one embodiment, upper adhesive 1402 is a preformed layer of epoxy.

However, in another embodiment, upper adhesive 1402 is a paste adhesive applied as a viscous paste. In accordance with this alternative embodiment, upper adhesive 1402 would have curved protruding sides instead of substantially vertical sides 1402S.

As set forth above, double-sided film spacer 1432 is mounted to upper surface 114U of lower electronic component 114 inward of bond pads 120. Adhesive bead 1042 is applied to upper surface 114U of lower electronic component 114 around double-sided film spacer 1432 in a manner similar to that discussed above with reference to FIG. 10.

Figure 15:
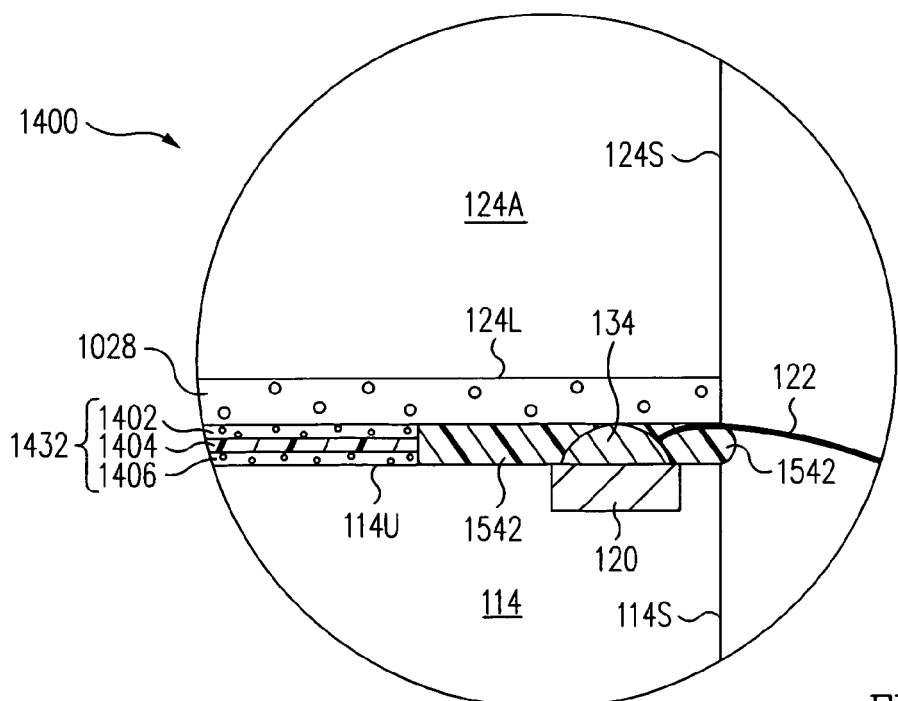
FIG. 15 is an enlarged cross-sectional view of the region of the stacked electronic component package of FIG. 14 at a later stage during fabrication in accordance with one embodiment of the present invention.

FIG. 15 is an enlarged cross-sectional view of the region of stacked electronic component package 1400 of FIG. 14 at a later stage during fabrication in accordance with one embodiment of the present invention. Referring now to FIGS. 14 and 15 together, upper electronic component 124A is moved downwards towards lower electronic component 114 until upper film adhesive 1028 contacts double-sided film spacer 1432, and, more particularly, upper adhesive 1402 of double-sided film spacer 1432, as shown in FIG. 15.

Upper film adhesive 1028 and upper adhesive 1402 are adhesive and thus adhesively bond to one another. Further, adhesive bead 1042 fills the region around double-sided film spacer 1432 and between upper film adhesive 1028 and upper surface 114U of lower electronic component 114 and is cured, if necessary, thus forming an electronic component filler 1542 as illustrated in FIG. 15. Specifically, adhesive bead 1042 is squeezed to cover bond pads 120 and lower bond wires 122 such that electronic component filler 1542 encloses double-sided film spacer 1432, covers bond pads 120 and lower bond wires 122, and completely fills the region between upper surface 114U of lower electronic component 114 and upper film adhesive 1028. Completion of fabrication of stacked electronic component package 1400 is similar to fabrication of electronic component package 100 of FIG. 1 and so is not repeated here.

Figure 16:
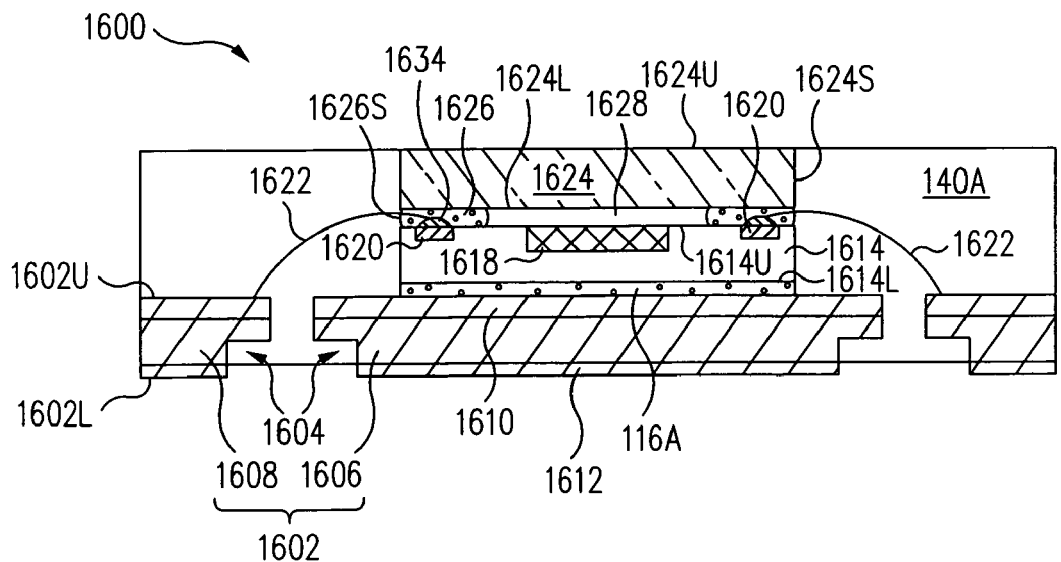
FIGS. 16, 17 are cross-sectional views of image sensor packages in accordance with embodiments of the present invention.

FIG. 16 is a cross-sectional view of an image sensor package 1600 in accordance with one embodiment of the present invention. Image sensor package 1600 includes a leadframe substrate 1602 formed of an electrically conductive material such as copper. Leadframe substrate 1602 includes an upper, e.g., first, surface 1602U and a lower, e.g., second, surface 1602L. In accordance with this embodiment, leadframe substrate 1602 is formed with a protruding lip 1604 at upper surface 1602U such that lower surface 1602L has a smaller total surface area than upper surface 1602U as those of skill in the art will understand. Leadframe substrate 1602 is sometimes called a half-etched leadframe substrate. Protruding lip 1604 is embedded in an encapsulant 140A preventing leadframe substrate 1602 from being pulled out of or otherwise disengaged from encapsulant 140A.

In accordance with this embodiment, leadframe substrate 1602 includes a die attach paddle 1606 and leads 1608. A lower, e.g., first, surface 1614L of an image sensor 1614, sometimes called a photodetector or sensor device, is attached to upper surface 1602U of die attach paddle 1606 of leadframe substrate 1602, e.g., with a die attach adhesive 116A.

Bond pads 1620 on an upper, e.g., second, surface 1614U of image sensor 1614 are wire bonded, i.e., electrically connected, to die attach paddle 1606 and/or leads 1608 of leadframe substrate 1602 with bond wires 1622, e.g., gold. In accordance with one embodiment, bond wires 1622 are bonded to bond pads 1620 using a reverse bonding technique, sometimes called stand-off stitch bonding (SSB) to minimize the loop height of bond wires 1622. In another embodiment, an ultra-low loop (ULL) process is used.

As is well known to those of skill in the art, in reverse bonding, a ball 1634 is initially formed on a bond pad 1620 and the wire is broken at the top of ball 1634. A similar ball is formed on the respective die attach paddle 1606 and/or lead 1608 and bond wire 1622 is then extended back to ball 1634. Bond wire 1622 is bonded to ball 134 and thus to bond pad 1620 using a standard stitch bond.

In accordance with this embodiment, leadframe substrate 1602 includes metallization layers 1610, 1612 on upper and lower surfaces 1602U, 1602L, respectively. Metallization layer 1610, e.g., gold, enhances the bond between bond wires 1622 and leadframe substrate 1602. Further, metallization layer 1612, e.g., solder plating, enhances the bondability with lower surface 1602L, for example, the solder wetability with lower surface 1602L. However, metallization layers 1610, 1612 are optional and in one embodiment are not formed.

An active area 1618 of image sensor 1614 is formed on upper surface 1614U. Generally, active area 1618 of image sensor 1614 is responsive to light, e.g., electromagnetic radiation, as is well known to those of skill in the art. For example, active area 1618 is responsive to infrared radiation, ultraviolet light, and/or visible light. Illustratively, image sensor 1614 is a CMOS image sensor device, a charge coupled device (CCD), a pyroelectric ceramic on CMOS device, or an erasable programmable read-only memory device (EPROM) although other image sensors are used in other embodiments.

A window 1624, sometimes called a lid, is mounted to image sensor 1614. More particularly, a lower, e.g., first, surface 1624L of window 1624 is mounted to upper surface 1614U of image sensor 1614 with a window adhesive 1626, sometimes called a lid adhesive. Window 1624 is transparent to the light to which active area 1618 is responsive, such that the light passes through window 1624 and to active area 1618.

In accordance with this embodiment, lower surface 1624L of window 1624 corresponds to upper surface 1614U of image sensor 1614. Stated another way, lower surface 1624L of window 1624 has the same shape, e.g., a rectangular shape having the same length and width, as upper surface 1614U of image sensor 1614 such that the total surface areas of lower surface 1624L and upper surface 1614U are equal. However, in other embodiments, the total area of lower surface 1624L of window 1624 is greater than or less than the total area of upper surface 1614U of image sensor 1614.

In accordance with this embodiment, window adhesive 1626 mounts the periphery of upper surface 1614U of image sensor 1614 to the periphery of lower surface 1624L of window 1624. Window adhesive 1626 covers bond pads 1620 and at least a portion of bond wires 1622. Window adhesive 1626 is a nonconductive material, sometimes called a dielectric or electrically insulating material. Illustratively, window adhesive 1626 is an adhesive, e.g., a B-stage film epoxy.

Window adhesive 1626 spaces window 1624 above the loop height of bond wires 1622, i.e., apart from bond wires 1622, although bond wires 1622 contact window 1624 in one embodiment. In another embodiment, bond wires 1622 act as a stand-off for window 1624 to prevent too much compression of window adhesive 1626 and overflow on to active area 1618.

Window adhesive 1626 does not cover active area 1618 or the central region of window 1624 in accordance with this embodiment. Accordingly, a cavity 1628 is formed by upper surface 1614U of image sensor 1614, lower surface 1624L of window 1624, and window adhesive 1626. Active area 1618 is located within cavity 1628.

In accordance with this embodiment, window adhesive 1626 is an adhesive film, sometimes called a film adhesive. Generally, window adhesive 1626 is a preformed film of adhesive, e.g., a layer or sheet of adhesive in a ring shape, e.g., a rectangular annulus. As such, window adhesive 1626 has sides 1626S which are substantially vertical and coincident with sides 1624S of window 1624. In one embodiment, window adhesive 1626 is a preformed ring of epoxy.

Leadframe substrate 1602, image sensor 1614, bond wires 1622, window adhesive 1626 and window 1624 are encapsulated in encapsulant 140A, e.g., using a transfer mold or liquid encapsulation process. As discussed above, lower surface 1602L of leadframe substrate 1602 is not covered by encapsulant 140A and exposed. Similarly, an upper, e.g., second, surface 1624U of window 1624 is not covered by encapsulant 140A and exposed.

Figure 17:
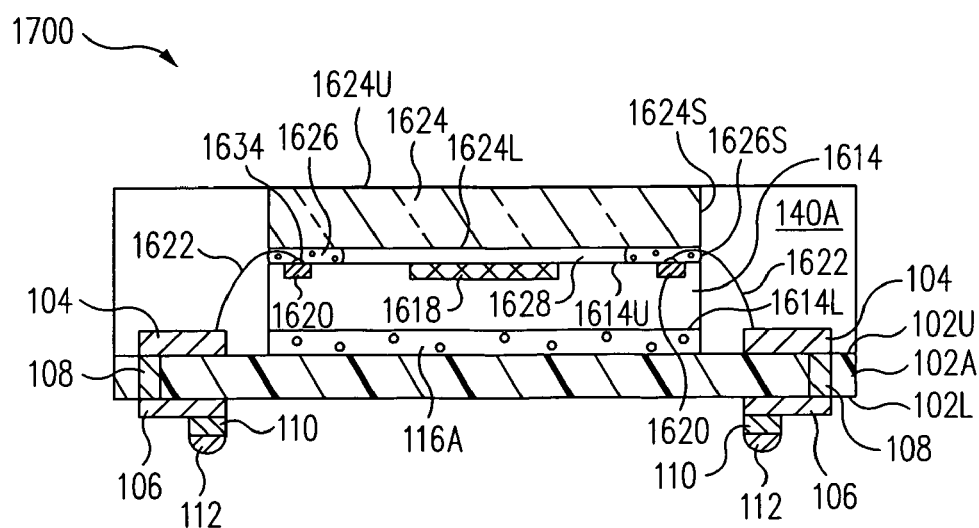

FIG. 17 is a cross-sectional view of an image sensor package 1700 in accordance with another embodiment of the present invention. Image sensor package 1700 of FIG. 17 is similar to image sensor package 1600 of FIG. 16 except that image sensor package 1700 of FIG. 17 includes a substrate 102A instead of a lead frame substrate 1602 of image sensor package 1600 of FIG. 16.

Further, substrate 102A of image sensor package 1700 is similar to substrate 102 of stacked electronic component package 100 of FIG. 1 discussed above. Specifically, upper surface 102U, lower surface 102L, upper traces 104, lower traces 106, vias 108, pads 110, interconnection balls 112 of substrate 102A of image sensor package 1700 of FIG. 17 are similar to upper surface 102U, lower surface 102L, upper traces 104, lower traces 106, vias 108, pads 110, interconnection balls 112 of substrate 102 of stacked electronic component package 100 of FIG. 1, respectively.

Referring now to FIG. 17, lower surface 1614L of image sensor 1614 is mounted to upper surface 102U of substrate 102A by die attach adhesive 116A. Bond pads 1620 of image sensor 1614 are connected to upper traces 104 of substrate 102A by bond wires 1622.

Upper surface 102U of substrate 102A, image sensor 1614, bond wires 1622, window adhesive 1626 and window 1624 are encapsulated in encapsulant 140A. Lower surface 102L of substrate 102A is not covered by encapsulant 140A and exposed. Similarly, upper surface 1624U of window 1624 is not covered by encapsulant 140A and exposed.

Figure 18:
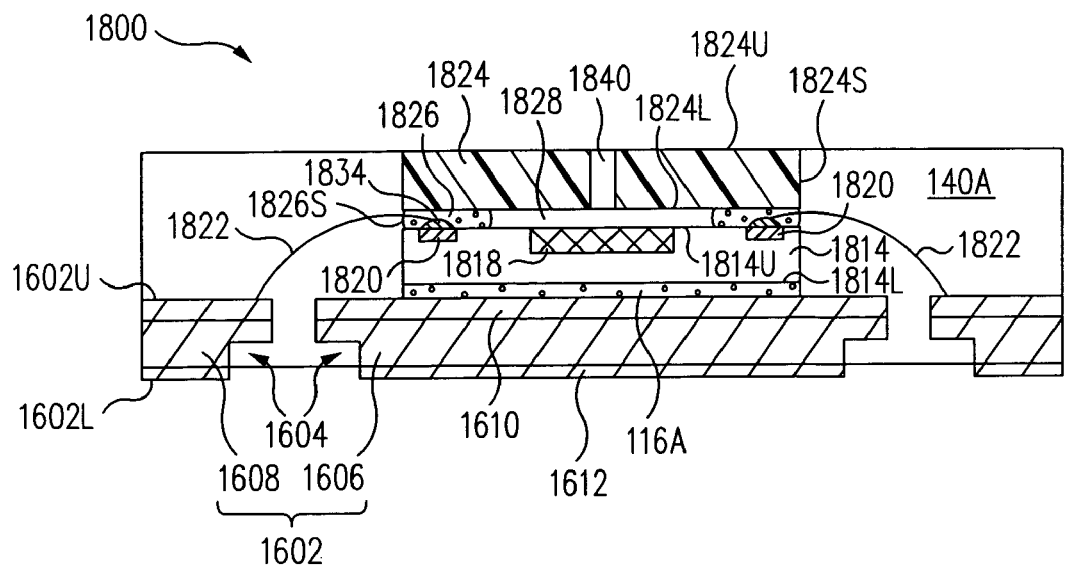
FIGS. 18, 19 are cross-sectional views of pressure sensor packages in accordance with embodiments of the present invention.

Image sensor packages 1600, 1700 have good optical properties, are small, and are fabricated at a low cost. Accordingly, image sensor packages 1600, 1700 are well suited for applications such as high definition DVD players FIG. 18 is a cross-sectional view of a pressure sensor package 1800 in accordance with one embodiment of the present invention. Pressure sensor package 1800 of FIG. 18 is similar to image sensor package 1600 of FIG. 16 and only the significant differences are discussed below. Referring now to FIG. 18, a lower, e.g., first, surface 1814L of a pressure sensor 1814, sometimes called a sensor device, is attached to upper surface 1602U of die attach paddle 1606 of leadframe substrate 1602, e.g., with a die attach adhesive 116A.

Bond pads 1820 on an upper, e.g., second, surface 1814U of pressure sensor 1814 are wire bonded, i.e., electrically connected, to die attach paddle 1606 and/or leads 1608 of leadframe substrate 1602 with bond wires 1822. In accordance with one embodiment, bond wires 1822 are bonded to bond pads 1820 using a reverse bonding technique, sometimes called stand-off stitch bonding (SSB) to minimize the loop height of bond wires 1822. In another embodiment, an ultra-low loop (ULL) process is used.

As is well known to those of skill in the art, in reverse bonding, a ball 1834 is initially formed on a bond pad 1820 and the wire is broken at the top of ball 1834. A similar ball is formed on the respective die attach paddle 1606 and/or lead 1608 and bond wire 1822 is then extended back to ball 1834. Bond wire 1822 is bonded to ball 1834 and thus to bond pad 1820 using a standard stitch bond.

An active area 1818 and bond pads 1820 of pressure sensor 1814 are formed on upper surface 1814U. Generally, active area 1818 of pressure sensor 1814 is responsive to pressure, e.g., ambient air pressure, as is well known to those of skill in the art. For example, active area 1818 is responsive to changes in pressure. Illustratively, pressure sensor 1814 is a microelectromechanical sensor (MEMS) although other pressure sensors are used in other embodiments.

A lid 1824, sometimes called an insert, is mounted to pressure sensor 1814. More particularly, a lower, e.g., first, surface 1824L of lid 1824 is mounted to upper surface 1814U of pressure sensor 1814 with a lid adhesive 1826. In one embodiment, lid 1824 is a dielectric material or includes a dielectric material on lower surface 1824L of lid 1824 such that contact of lid 1824 with bond wires 1822 does not short bond wires 1822. However, in another embodiment, lid 1824 is an electrically conductive material, e.g., metal. Other examples of lid 1824 include high temperature plastic and liquid crystal polymer (LCP). Lid 1824 is optically transparent or opaque depending upon the particular embodiment.

In accordance with one embodiment, lower surface 1824L of lid 1824 corresponds to upper surface 1814U of pressure sensor 1814. Stated another way, lower surface 1824L of lid 1824 has the same shape, e.g., a rectangular shape having the same length and width, as upper surface 1814U of pressure sensor 1814 such that the total surface areas of lower surface 1824L and upper surface 1814U are equal. However, in other embodiments, the total area of lower surface 1824L of lid 1824 is greater than or less than the total area of upper surface 1814U of pressure sensor 1814.

In accordance with this embodiment, lid adhesive 1826 mounts the periphery of upper surface 1814U of pressure sensor 1814 to the periphery of lower surface 1824L of lid 1824. Lid adhesive 1826 covers bond pads 1820 and at least a portion of bond wires 1822. Lid adhesive 1826 is a nonconductive material, sometimes called a dielectric or electrically insulating material. Lid adhesive 1826 spaces lid 1824 above the loop height of bond wires 1822, i.e., apart from bond wires 1822, although bond wires 1822 contact lid 1824 in one embodiment. In another embodiment, bond wires 1822 act as a stand-off to prevent too much compression of lid adhesive 1826 and overflow on to active area 1818.

Lid adhesive 1826 does not cover active area 1818 in accordance with this embodiment. Accordingly, a cavity 1828 is formed by upper surface 1814U of pressure sensor 1814, lower surface 1824L of lid 1824, and lid adhesive 1826. Active area 1818 is located within cavity 1828.

Lid 1824 includes an aperture 1840, sometimes called a pressure port, extending from an upper, e.g., second, surface 1824U to lower surface 1824L of lid 1824. Aperture 1840 causes the pressure within cavity 1828 and at active area 1818 to be the same as ambient pressure, i.e., the pressure outside of pressure sensor package 1800. Further, as cavity 1828 is in fluid communication with the ambient environment through aperture 1840, the pressure within cavity 1828 and at active area 1818 changes as the ambient pressure changes.

In accordance with this embodiment, lid adhesive 1826 is an adhesive film, sometimes called a film adhesive. Generally, lid adhesive 1826 is a preformed film of adhesive, e.g., a layer or sheet of adhesive in a ring shape, e.g., a rectangular annulus. As such, lid adhesive 1826 has sides 1826S which are substantially vertical and coincident with sides 1824S of lid 1824. In one embodiment, lid adhesive 1826 is a preformed ring of epoxy.

Leadframe substrate 1602, pressure sensor 1814, bond wires 1822, lid adhesive 1826 and lid 1824 are encapsulated in encapsulant 140A. As discussed above, lower surface 1602L of leadframe substrate 1602 is not covered by encapsulant 140A and exposed. Similarly, upper surface 1824U of lid 1824 and specifically aperture 1840 is not covered by encapsulant 140A and exposed.

Figure 19:
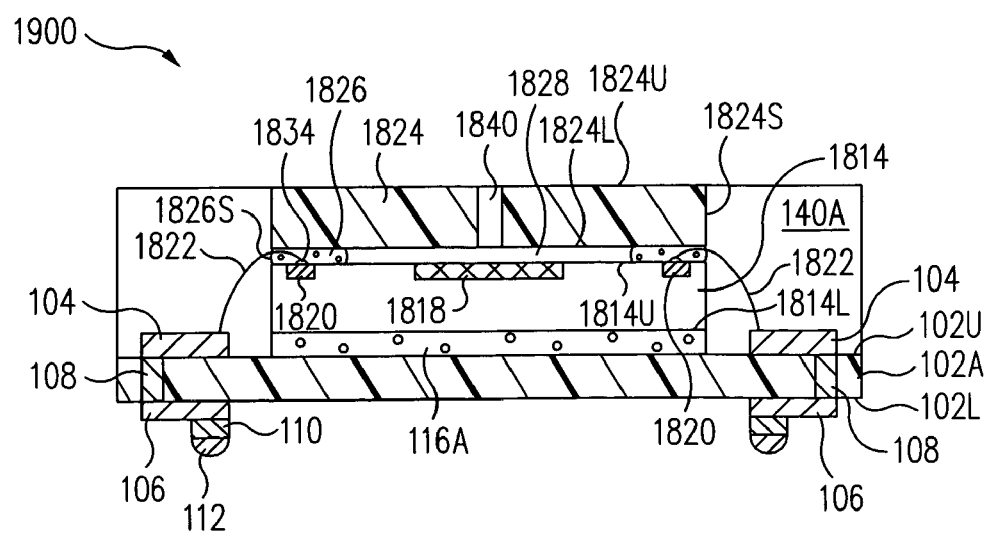

FIG. 19 is a cross-sectional view of a pressure sensor package 1900 in accordance with another embodiment of the present invention. Pressure sensor package 1900 of FIG. 19 is similar to pressure sensor package 1800 of FIG. 18 except that pressure sensor package 1900 of FIG. 19 includes a substrate 102A similar to substrate 102A of image sensor package 1700 of FIG. 17, discussed above.

Referring now to FIG. 19, lower surface 1814L of pressure sensor 1814 is mounted to upper surface 102U of substrate 102A by die attach adhesive 116A. Bond pads 1820 of pressure sensor 1814 are connected to upper traces 104 of substrate 102A by bond wires 1822.

Upper surface 102U of substrate 102A, pressure sensor 1814, bond wires 1822, lid adhesive 1826 and lid 1824 are encapsulated in encapsulant 140A. Lower surface 102L of substrate 102A is not covered by encapsulant 140A and exposed. Similarly, upper surface 1824U of lid 1824 and specifically aperture 1840 is not covered by encapsulant 140A and exposed.

Figure 20:
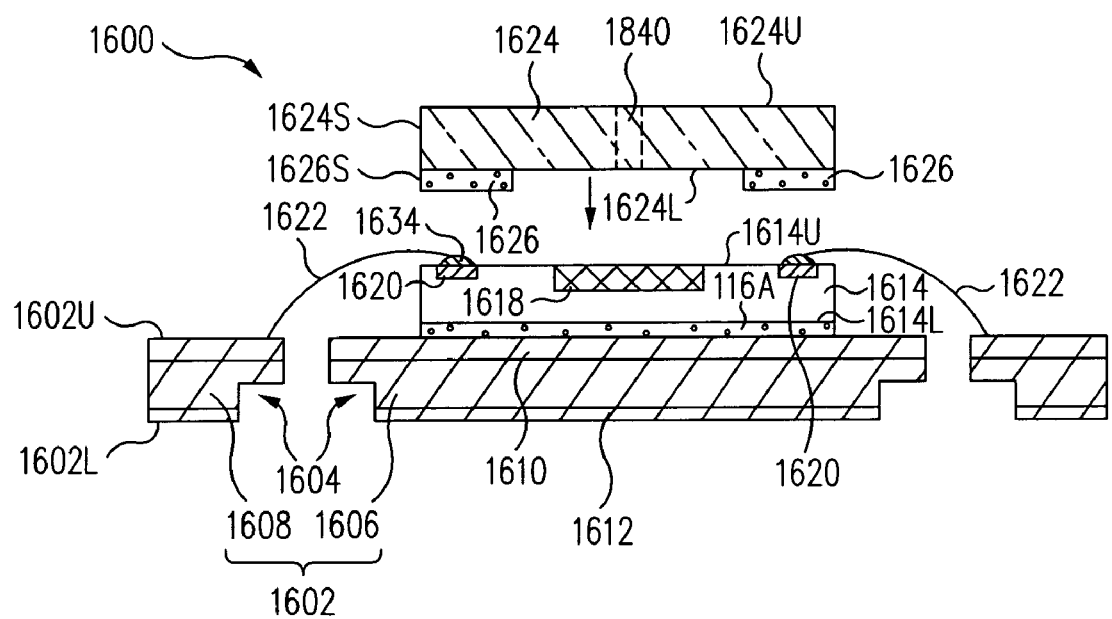
FIG. 20 is a cross-sectional view of the image sensor package of FIG. 16 during fabrication in accordance with one embodiment of the present invention.

FIG. 20 is a cross-sectional view of image sensor package 1600 of FIG. 16 during fabrication in accordance with one embodiment of the present invention. Referring now to FIG. 20, image sensor 1614 is die attached with adhesive 116A to die attach paddle 1606 of leadframe substrate 1602. Bond pads 1620 are electrically connected to die attach paddle 1606 and/or leads 1608 of leadframe substrate 1602 with bond wires 1622.

Window adhesive 1626 is placed on and covers the periphery of lower surface 1624L of window 1624. Illustratively, a patterned sheet of film adhesive is applied to the lower surface of a window sheet having a plurality of windows 1624. The patterned sheet of film adhesive is singulated during singulation of window 1624 from the window sheet thus forming window adhesive 1626 connected to and covering the periphery of lower surface 1624L of window 1624.

In one embodiment, window 1624 and thus window adhesive 1626 is pressed downward on to upper surface 1614U of image sensor 1614 to ensure good adhesion between window adhesive 1626 and upper surface 1614U of image sensor 1614. Further, during pressing, window adhesive 1626 is presses on to bond wires 1622, which press into window adhesive 1626. In one embodiment, window adhesive 1626 is cured, e.g., thermally or optically, further causing window adhesive 1626 to flow around and envelop bond wires 1622.

In another embodiment, window adhesive 1626 is epoxy dispensed on the periphery of upper surface 1614U of image sensor 1614.

Referring again to FIG. 16, to complete fabrication of image sensor package 1600, leadframe substrate 1602, image sensor 1614, bond wires 1622, window adhesive 1626 and window 1624 are encapsulated in encapsulant 140A.

Although fabrication of image sensor package 1600 of FIG. 16 is discussed and illustrated in FIG. 20, in light of this disclosure, those of skill in the art will understand that image sensor package 1700 of FIG. 17 and pressure sensor packages 1800, 1900 of FIGS. 18, 19, respectively, are fabricated in a similar manner. For example, in the example when pressure sensor package 1800 is fabricated, a lid having an aperture 1840 as illustrated by the dash lines in FIG. 20 and a lid adhesive are used instead of window 1624 and window adhesive 1626, respectively.

Although fabrication of packages in accordance with various embodiments as a single unit is described above, in other embodiment, a plurality of packages of fabricated simultaneously, e.g., in an assembly, and the assembly is singulated to singulated the individual packages.

This application is related to St. Amand et al., commonly assigned and co-filed U.S. patent application Ser. No. 11/356,919, entitled "STACKED ELECTRONIC COMPONENT PACKAGE HAVING SINGLE-SIDED FILM SPACER", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A stacked electronic component package comprising:
a first electronic component having a first surface, a second surface, and sides, the second surface of the first electronic component comprising bond pads;
a film-on-wire spacer coupled to and covering the second surface of the first electronic component including the bond pads, the film-on-wire spacer comprising:
an upper film adhesive comprising a first adhesive;
a dielectric spacer comprising sides; and
a lower film adhesive comprising a second adhesive different than the first adhesive, the lower film adhesive comprising sides, wherein the sides of the first electronic component, the sides of the lower film adhesive and the sides of the spacer are substantially vertical and coincident with one another; and
a second electronic component having a first surface coupled to the film-on-wire spacer.

2. The stacked electronic component package of claim 1 wherein the second electronic component is larger than the first electronic component.

3. The stacked electronic component package of claim 2 wherein the upper film adhesive covers an entire first surface of the second electronic component.

4. The stacked electronic component package of claim 1 wherein the upper film adhesive has a greater adhesiveness than the lower film adhesive.

5. The stacked electronic component package of claim 1 wherein the lower film adhesive is more compliant that the upper film adhesive.

6. The stacked electronic component package of claim 1 wherein the spacer comprises a flexible film.

7. The stacked electronic component package of claim 1 wherein the spacer comprises an organic film.

8. A stacked electronic component package comprising:
a first electronic component having a first surface, a second surface, and sides, the second surface of the first electronic component comprising bond pads;
a film-on-wire spacer coupled to and covering the second surface of the first electronic component including the bond pads, the film-on-wire spacer comprising:
an upper film adhesive;
a dielectric spacer comprising sides; and
a lower film adhesive comprising sides, wherein the sides of the first electronic component, the sides of the lower film adhesive and the sides of the spacer are substantially vertical and coincident with one another; and
lower bond wires coupled to the bond pads of the first electronic component, the lower bond wires being enclosed within and protected by the lower film adhesive; and
a second electronic component having a first surface coupled to the film-on-wire spacer.

9. The stacked electronic component package of claim 8 further comprising a substrate, the first surface of the first electronic component being coupled to a first surface of the substrate.

10. The stacked electronic component package of claim 9 wherein the substrate comprises first traces on the first surface of the substrate, the lower bond wires further being coupled to the first traces.

11. The stacked electronic component package of claim 10 wherein the second electronic component further comprises a second surface having bond pads thereon.

12. The stacked electronic component package of claim 11 further comprising upper bond wires coupling the bond pads of the second electronic component to the first traces.

13. The stacked electronic component package of claim 8 wherein the film-on-wire spacer covers the entire first surface of the second electronic component.

14. A stacked electronic component package comprising:
a substrate comprising first traces on a first surface of the substrate;
a first electronic component having a first surface, a surface, and sides, the first surface of the first electronic component being coupled to the first surface of the substrate, the second surface of the first electronic component comprising bond pads;
a film-on-wire spacer coupled to and covering the second surface of the first electronic component including the bond pads, the film-on-wire spacer comprising:
an upper film adhesive comprising a first adhesive;
a dielectric spacer comprising sides; and
a lower film adhesive comprising a second adhesive different than the first adhesive, the lower film adhesive comprising sides, wherein the sides of the first electronic component, the sides of the lower film adhesive and the sides of the spacer are substantially vertical and coincident with one another; and
lower bond wires coupled to the bond pads of the first electronic component and the first traces, the lower bond wires being enclosed within and protected by the lower film adhesive; and
a second electronic component having a first surface coupled to the film-on-wire spacer.

15. The stacked electronic component package of claim 14 wherein the second electronic component further comprises a second surface having bond pads thereon.

16. The stacked electronic component package of claim 15 further comprising upper bond wires coupling the bond pads of the second electronic component to the first traces.

17. The stacked electronic component package of claim 14 wherein the film-on-wire spacer covers the entire first surface of the second electronic component and the entire second surface of the first electronic component.

18. A stacked electronic component package comprising:
a first electronic component having a first surface, a second surface, and sides, the second surface of the first electronic component comprising bond pads;
a film-on-wire spacer coupled to and covering the second surface of the first electronic component including the bond pads, the film-on-wire spacer comprising:
an upper film adhesive comprising sides;
a dielectric spacer comprising sides; and
a lower film adhesive comprising sides;
lower bond wires coupled to the bond pads of the first electronic component, the lower bond wires being enclosed within and protected by the lower film adhesive; and
a second electronic component having a first surface coupled to the film-on-wire spacer, a second surface, and sides, wherein the sides of the first electronic component, the sides of the lower film adhesive, the sides of the spacer, the sides of the upper film adhesive and the sides of the second electronic component are substantially vertical and coincident with one another.

19. The stacked electronic component package of claim 18 further comprising a substrate, the first surface of the first electronic component being coupled to a first surface of the substrate, wherein the substrate comprises first traces on the first surface of the substrate, the lower bond wires further being coupled to the first traces.

* * * * *

UNITED STATES PATENT AND TRADEMARK OFFICE
CERTIFICATE OF CORRECTION

| | |
|---|---|
| PATENT NO. | : 7,675,180 B1 |
| APPLICATION NO. | : 11/356921 |
| DATED | : March 9, 2010 |
| INVENTOR(S) | : Roger D. St. Amand et al. |

It is certified that error appears in the above-identified patent and that said Letters Patent is hereby corrected as shown below:

In Column 22, Line 45, Claim 14, after "a first surface, a", insert --second--.

Signed and Sealed this

Twenty-ninth Day of June, 2010

David J. Kappos
*Director of the United States Patent and Trademark Office*